US009391284B2

(12) United States Patent
Thompson et al.

(10) Patent No.: US 9,391,284 B2
(45) Date of Patent: Jul. 12, 2016

(54) ORGANIC PHOTOSENSITIVE OPTOELECTRONIC DEVICES WITH TRIPLET HARVESTING

(75) Inventors: Mark E. Thompson, Anaheim, CA (US); Maria Dolores Perez, Marina del Rey, CA (US); Carsten Borek, Heldenfingen (DE); Peter I. Djurovich, Long Beach, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 16 days.

(21) Appl. No.: 13/366,339

(22) Filed: Feb. 5, 2012

(65) Prior Publication Data

US 2012/0228586 A1 Sep. 13, 2012

Related U.S. Application Data

(63) Continuation of application No. 12/190,265, filed on Aug. 12, 2008, now abandoned.

(60) Provisional application No. 60/955,485, filed on Aug. 13, 2007.

(51) Int. Cl.
*H01L 51/00* (2006.01)
*B82Y 10/00* (2011.01)
*H01L 51/42* (2006.01)

(52) U.S. Cl.
CPC .......... *H01L 51/0087* (2013.01); *B82Y 10/00* (2013.01); *H01L 51/002* (2013.01); *H01L 51/4246* (2013.01); *H01L 51/0036* (2013.01); *H01L 51/0037* (2013.01); *H01L 51/0046* (2013.01); *H01L 51/0054* (2013.01); *H01L 51/4253* (2013.01); *H01L 2251/308* (2013.01); *Y02E 10/549* (2013.01)

(58) Field of Classification Search
USPC ............. 136/263; 427/402; 540/139; 257/40
See application file for complete search history.

(56) References Cited

U.S. PATENT DOCUMENTS

| | | | |
|---|---|---|---|
| 6,352,777 B1 | 3/2002 | Bulovic et al. | |
| 6,420,648 B1 | 7/2002 | Lindsey | |
| 6,580,027 B2 | 6/2003 | Forrest et al. | |
| 6,657,378 B2 | 12/2003 | Forrest et al. | |
| 2001/0027252 A1 | 10/2001 | Kobuke et al. | |
| 2005/0061364 A1 | 3/2005 | Peumans et al. | |
| 2006/0027834 A1* | 2/2006 | Forrest et al. ............... | 257/183 |
| 2008/0061681 A1* | 3/2008 | Thompson et al. .......... | 313/504 |
| 2008/0103279 A1 | 5/2008 | Heun et al. | |
| 2008/0311304 A1* | 12/2008 | Thompson et al. .......... | 427/402 |
| 2009/0235971 A1* | 9/2009 | Pfeiffer et al. ............... | 136/244 |

FOREIGN PATENT DOCUMENTS

| | | |
|---|---|---|
| JP | 58 190074 A | 11/1983 |
| JP | A-2002-008861 | 1/2002 |
| JP | A-2005-236278 | 9/2005 |
| JP | A-2005-338661 | 12/2005 |
| WO | WO 2004/008554 A | 1/2004 |
| WO | WO 2006/092135 A | 9/2006 |

OTHER PUBLICATIONS

Paci et al, SInglet fission for Dye-Sensitized Solar Cells: Can a Suitable sensitizer be Found?, J. Am. Chem. Soc. 2006, 128, 16546-16553.*
Benanti, T. L. et al., Organic solar cells: An overview focusing on active layer morphology, Photosynthesis Research 2006, 87, (1), pp. 73-81.
Brabec, C.J. et al., Origin of the open circuit voltage of plastic solar cells, Advanced Functional Materials, 2001. 11, No. 5, pp. 374-380.
Chu, C, W. et al., Efficient photovoltaic energy conversion in tetracene-$C_{60}$ based heterojunctions, Applied Physics Letters 86, 2005, pp. 243506-1 thru 243506-3.
Davies M., et al. Future generation technology status within the highperformance PV project, Photovoltaic Energy Conversion, Conference Record of the 2006 IEEE 4th World Conference on IEEE, PI, vol. 1, May 7, 2006, pp. 175-178, XP031007266 ISBN: 978-1-4244-0016-4, figure 2.
Gledhill, S.E. et al., Organic and nano-structured composite photovoltaics. An overview, Journal of Materials Research, 2005, vol. 20, No. 12, pp. 3167-3179.
International Search Report for PCT Application Serial No. PCT/US08/72896, mailed on Dec. 5, 2008.
Mutolo, K.L., et al., Enhanced open-circuit voltage in subphthalocyanine/C-60 organic photovoltaic cells, Journal of the American Chemical Society, 2006, 128 (25), pp. 8108-8109.
Nelson, J., Organic photovoltaic films, Current Opinion in Solid State & Materials Science 6 (2002), pp. 87-95.
Paci, I. et al., J. Am. Chem. Soc., vol. 128,2006, pp. 16546-16553, XP002502946 the whole document.
Peumans, P. et al., Small molecular weight organic thin-film photodetectors and solar cells, Journal of Applied Physics, 2003, vol. 93, No. 7, pp. 3693-3723.
Rand, B. P. et al., Long-range absorption enhancement in organic tandem thin-film solar cells containing silver nanoclusters, Journal of Applied Physics 2004, vol. 96, No. 12, pp. 7519-7526.
Singh, V.P. et al., Copper-phthalocyanine-based organic solar cells with high opencircuit voltage, Applied Physics Letters 86, 2005, pp. 082106-1 thru 082106-3.
Smestad G P., Absorptivity as a predictor of the photoluminescence spectra of silicon solar cells and photosynthesis, Solar Energy Materials and Solar Cells, Elsevier Science Publishers, Amsterdam, NL, vol. 38, No. 1/4, Aug. 1, 1995, pp. 57-71, XP004005354, ISSN: 0927-0248, the whole document.

(Continued)

*Primary Examiner* — Monique Peets
(74) *Attorney, Agent, or Firm* — Finnegan, Henderson, Farabow, Garrett & Dunner, LLP

(57) ABSTRACT

There is disclosed an organic photosensitive optoelectronic devices comprising organic photoconductive materials, which comprise singlet fission host materials doped with triplet forming materials. There is also disclosed devices made from such materials, such as an organic photovoltaic cell, a photoconductor cell, a photodetector, organic photosensors, chemical sensors, and biological sensors. Methods of fabricating such devices are also disclosed.

45 Claims, 4 Drawing Sheets

(56) References Cited

OTHER PUBLICATIONS

Sun Yiru et al., Photophysics of Pt-porphyrin electrophosphorescent devices emitting in the near infrared, Applied Physics Letters, AIP, American Institute of Physics, Melville, NY, vol. 90, No. 21, May 21, 2007, pp. 213503-1-213503-3, XP012094989, ISSN: 0003-6951, the whole document.

Terao, Y. et al., Correlation of hole mobility, exciton diffusion length, and solar cell characteristics in phthalocyanine/fullerene organic solar cells, Applied Physics Letters 90, 2007 pp. 103515-1 thru 1035153.

Uchida, S. et al., Organic small molecule solar cells with a homogeneously mixed copper phthalocyanine: $C_{60}$ active layer, Applied Physics Letters 2004, vol. 84, No. 21, pp. 4218-4220.

Wang X et al., Electrophosphorescence from substituted poly(thiophene) doped with iridium or platinum complex, Thin Solid Films, Elsevier-Sequoia S.A.Lausanne, CH, vol. 468, No. 1-2, Dec. 1, 2004, pp. 226-233, XP004579177, ISSN: 0040-6090, figures 1,7; tables 1, 2.

Xue, J. et al., Asymmetric tandem organic photovoltaic cells with hybrid planar-mixed molecular heterojunctions, Applied Physics Letters 2004, vol. 85, No. 23, pp. 5757-5759.

Yang, F.; et al., Controlled growth of a molecular bulk heterojunction photovoltaic cell, Nat Mater 2005, vol. 4, pp. 37-41.

Yoo, S. et al., Efficient thin-film organic solar cells based on pentacene/$C_{60}$ heterojunctions, Applied Physics Letters 2004, vol. 85, No. 22, pp. 5427-5429.

Borek, Carsten, et al., "Highly Efficient, Near-Infrared Electrophophoresence from a Pt-Metalloporphyrin Complex," Angewandt Chmie, Jan. 9, 2007, International Edition, vol. 46, 2007, p. 1109-1112.

Retsek, J. L., et al., "Conformational and Electronic Effects of Phenyl-Ring Fluorination on the Photophysical Properties of Nonplanar Dodec aarylporphyrins," Journal of Physical Chemistry B, Jun. 16, 2001, vol. 105, p. 6936-6411.

Rogers, J. E., et al., "Observation and Interpretation of Annulated Porphyins: Studies on the Photophysical Properties of meso-Tetraphenylmetalloporphyrins," Journal of Physical Chemistry A, Dec. 2, 2003, vol. 107, p. 11331-11339.

Sazanovich I. V., et al., "Photophysical and Structural Properties of Saddle-Shaped Free Base Porphyrins: Evidence for an 'Orthogonal' Dipole Moment," Journal of Physical Chemistry, Jul. 20, 2001, vol. 105, p. 7818-7829.

* cited by examiner

Scheme 1: Description of the singlet fission energetics

Scheme 2: Dopant triplet quenching into triplet state of the host

Scheme 3: Quenching of host singlet by donor singlet and further conversion and transfer into triplet of the host Scheme 4: Overall process of proposed enhanced triplet creation on the host

US 9,391,284 B2

ORGANIC PHOTOSENSITIVE OPTOELECTRONIC DEVICES WITH TRIPLET HARVESTING

This application is a continuation of U.S. application Ser. No. 12/190,265, filed Aug. 12, 2008, and claims the benefit of U.S. provisional application No. 60/955,485 filed Aug. 13, 2007, the disclosures of which are incorporated herein by reference.

FIELD OF THE INVENTION

The present invention generally relates to organic photosensitive optoelectronic devices comprising organic photoconductive materials which comprise singlet fission host materials doped with triplet forming materials.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 dissociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

One common feature of bulk semiconductors, as well as insulators, is a "band gap." The band gap is the energy difference between the highest energy level filled with electrons and the lowest energy level that is empty. In an inorganic semiconductor or inorganic insulator, this energy difference is the difference between the valence band edge (top of the valence band) and the conduction band edge (bottom of the conduction band). In an organic semiconductor or organic insulator, this energy difference is the difference between the HOMO and the LUMO. The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band model for organic semiconductors, only electrons on the LUMO side of the band gap are charge carriers, and only holes on the HOMO side of the band gap are charge carriers.

Additional background explanation and description of the state of the art for organic photosensitive devices, including their general construction, characteristics, materials, and features, can be found in U.S. Pat. No. 6,657,378 to Forrest et al., U.S. Pat. No. 6,580,027 to Forrest et al., and U.S. Pat. No. 6,352,777 to Bulovic et al., the disclosures of which are incorporated herein by reference.

The performances of small molecular solar cells are determined by studying their characteristic IV responses under dark conditions and under illumination. The power conversion efficiency, $\eta_p$, is dependent on the open circuit voltage ($V_{oc}$), the short-circuit current density ($J_{sc}$), and the fill factor (FF) via [Ref. 1]:

$$\eta_p = (J_{sc} \times V_{oc} \times FF)/P_o \qquad (1)$$

where $P_o$ is the incident optical power. Here, FF depends on the series resistance and is typically between 0.5 and 0.65 for high performance small molecular weight organic photovoltaics. The maximum $J_{sc}$ is defined by the overlap between the absorption of the organics, the solar spectrum and the extinction coefficients and thicknesses of the absorbing layers and other factors. However, the photocurrent is highly dependent on the charge transport properties of the materials, since resistivity to charge flow represents a significant challenge to cell performance [Ref. 2]. Another very important parameter to be considered when referring to cell performance is the exciton diffusion length. The exciton diffusion length of a material represents the distance that an exciton can travel prior to recombination. Accordingly, in order to achieve a high percentage of charge carriers relative to the number of excitons created by absorbed photons the exciton is preferably formed within about $L_D$ of a Heterojunction. The exciton diffusion length, $L_D$, is related to the exciton diffusion coefficient, D, and the exciton lifetime, $\tau$, by the expression: $L_D = \sqrt{D\tau}$. The exciton diffusion length is generally short for organic semiconductors relative to the optical absorption length $L_A$, hence limiting the thickness of the organic layer to be used due to the relatively low ability of the excitons to reach the Donor-Acceptor interface for charge separation. This effect not only restrains the amount of absorbing material but also creates a resistive pathway for separated charge that is undesirable for efficient light conversion [Ref. 1].

The origin of Voc in organic solar cells is not well understood [Refs. 3,4]. Some people suggest that it is mainly dependent on the energy difference between the lowest unoccupied molecular orbital (LUMO) of the acceptor-like material and the highest occupied molecular orbital (HOMO) of the donor-like material at the heterointerface in a bilayer cell (referred to as the interface gap, Ig) [Ref. 5]. However others have observed no evident relation between this Ig and the Voc observed and propose that this voltage is controlled by a chemical potential gradient that would depend on the carrier mobility [Ref. 6]. Yet, it is clear that the Voc does not reflect the total energy of the photons absorbed and that energy must be lost during the power conversion process. These losses have not been accounted for so far and much care must be taken when assessing the foundations of the open-circuit voltage.

Organic photovoltaic (OPV) cells have great promise to become a viable alternative to the existing solar cell technologies, dominated by silicon based devices. However, their efficiencies are currently too low to compete effectively with Si based devices. The record efficiencies for laboratory based OPV cells is 5.7%, [Ref. 7] which is roughly half the efficiency of commercial amorphous silicon based PV cells. An inherent limitation of the current OPV systems is related to light collection efficiency, which is controlled by the excitons diffusion length. New device architectures have been developed to compensate for the short diffusion lengths, but there has not been a detailed study of applicable materials, focused on solving the problem by extending the diffusion length. [Refs. 8,9]

The basic mechanism of photocurrent generation in organic photovoltaic cells (OPVs) can be illustrated with two organic materials, one a net electron donor (D) and the other an acceptor (A). The process can be broken down into four sequential steps (FIG. 2). The first step of the process is light absorption, leading to exciton formation, with an efficiency given by $\eta_A$. In order to cover a large fraction of the solar spectrum, the donor and acceptor materials chosen for OPVs must have broad absorbance lines and high extinction coefficients, giving a high optical density for thin films.

Once formed, the exciton then migrates to the D/A interface, or alternatively decays to the ground state via radiative or nonradiative processes ($k_{decay}$). The optimal thickness is determined by the exciton diffusion length, since excitons generated beyond this distance decay faster then they migrate to the D/A interface. The efficiency of exciton diffusion ($\eta_{ED}$) is related to the relative magnitudes of the diffusion rate ($k_{diff}$) and the decay rate ($k_{decay}$). The majority of the OPV materials that have been examined have short exciton diffusion lengths. For example, CuPC and $C_{60}$, common donor and acceptor materials, have exciton diffusion lengths of 8-10 and 40 nm, respectively. The short exciton diffusion lengths seen for these materials forces the D and A films to be kept thin, limiting the optical density in OPVs, and thus the amount of light that can be efficiently collected and the efficiency of OPVs.

At the D/A interface, the exciton undergoes a charge transfer reaction (efficiency=$\eta_{CT}$), forming a hole and electron in the D and A layers, respectively. The driving force for charge transfer is the energy offset between the donor and acceptor orbitals. After the hole and electron are generated, they are conducted through the D and A materials and extracted by the electrodes (charge collection). A high carrier mobility is critical for an efficient OPV. A low mobility (high resistance) material will leave charges trapped near the D/A interface, promoting back electron transfer (recombination of the hole and electron at the interface). This leads to a decreased photocurrent and a marked decrease in the fill factor, both contributing to lower the power available for the device.

A number of different approaches have been explored to increase the optical densities of OPVs, without decreasing exciton collection at the D/A interface. One beneficial approach is to stack the OPVs, making a tandem cell [Refs. 9,10], for example, see FIG. 3A. Tandem OPVs have been shown to give up to two times the power output of a single OPV of the same structure. [Ref. 9] An alternate approach has been used broadly in polymer based OPVs, which involves the use of a bulk heterojunction. [Refs. 11,12] If the D and A materials are mixed, they tend to phase separate into microdomains of pure D and A, which provide the respective charge conducting channels. This bulk heterojunction material can be made thick enough to absorb the majority of the incident light, without forming excitons that are too far from the D/A interface to be collected. (FIGS. 3A-B)

The basic strategy for attacking the short exciton diffusion lengths in OPV materials in both tandem and bulk heterojunction devices involve increasing light absorbance, without trying to deal with the short exciton diffusion length directly. These approaches involve device structure changes and not new materials design. The problem with this approach is that it does not address the underlying problem, which is the short exciton diffusion length of these organic semiconductors.

The exciton diffusion length, $L_D$, is related to the exciton diffusion coefficient, D, and the exciton lifetime, $\tau$, by the expression: $L_D = \sqrt{D\tau}$. The highest exciton diffusion coefficients will be observed for single crystalline thin films. The amorphous glasses used in typical OPV cells tend to have lower diffusion coefficients, due to exciton scattering at defect sites. The exciton formed on light absorption is in a singlet configuration. The radiative lifetime of this exciton is typically 10 nsec or less. The measured lifetimes for singlet excitons in neat thin films are markedly lower than their radiative lifetime, due to excimer formation, quenching at defects and unimolecular nonradiative decay, principally intersystem crossing to the triplet exciton. The exciton diffusion coefficient for a singlet exciton can be rather high, since Forster energy transfer processes are operative, allowing hops of several nm at a time. Triplet excitons have lifetimes that are markedly longer than their singlet counterparts. While an organic molecule can have a singlet lifetime in the nsec range, the triplet lifetime of the same material can be as high as minutes to hours in a dilute sample. Based on the $L_D = \sqrt{D\tau}$ relationship, it would be expected to see long diffusion lengths for triplet excitons. While triplet exciton diffusion lengths can be reasonably long, for example $C_{60}$ gives an $L_D$ of 40 nm for an amorphous thin film, they are not as long as one would have guessed from the triplet lifetime. There are several reasons for this. The first reason is that the lifetime in a neat thin film is markedly less than that in a dilute matrix, where it is often measured. Quenching, excimer formation and T-T annihilation decrease triplet lifetimes by several orders of magnitude. Also, the diffusion coefficients for triplets are markedly lower than those for singlets. In contrast to singlets, Forster energy transfer processes are not very efficient, due largely to the low oscillator strengths for triplet absorption bands. Thus, triplet exciton diffusion occurs mainly through nearest neighbor hopping, via a Dexter mechanism. While the triplet lifetimes for common organic molecules can be very long, common OPV materials have triplet lifetimes in the microsecond regime. This coupled with the low D values give triplet based materials good but not exceptional $L_D$ values.

If one could increase the exciton diffusion length for OPV materials, devices could be fabricated with thick, optically dense D and A layers. Thus, there is a need to provide organic photosensitive optoelectronic devices having improved properties via new materials design, which addresses the issue of the exciton diffusion length.

SUMMARY OF THE INVENTION

The present invention provides a photosensitive optoelectronic device comprising an anode, a cathode and at least one photoactive region disposed between the anode and cathode wherein:

- the at least one photoactive region comprises at least one organic photoconductive material comprising at least one singlet fission host material and at least one triplet forming dopant material;
- the amount of the at least one singlet fission host material is greater than the amount of the at least one triplet forming dopant material;
- the at least one singlet fission host material is selected from a material that exhibits singlet fission when light is absorbed; and
- the at least one triplet forming dopant material forms a triplet exciton after light is absorbed by the dopant.

In another embodiment, the present invention provides a method of fabricating the organic photosensitive optoelectronic device of the invention, comprising:

providing an anode, a cathode and putting at least one organic photoconductive material in contact with at least the anode or cathode wherein:

- the at least one organic photoconductive material comprises at least one singlet fission host material and at least one triplet forming dopant material;
- the amount of the at least one singlet fission host material is greater than the amount of the at least one triplet fission dopant material;
- the at least one singlet fission host material is selected from a material that exhibits singlet fission when light is absorbed; and
- the at least one triplet forming dopant forms a triplet exciton after light is absorbed by the dopant.

DETAILED DESCRIPTION

Figure 1:
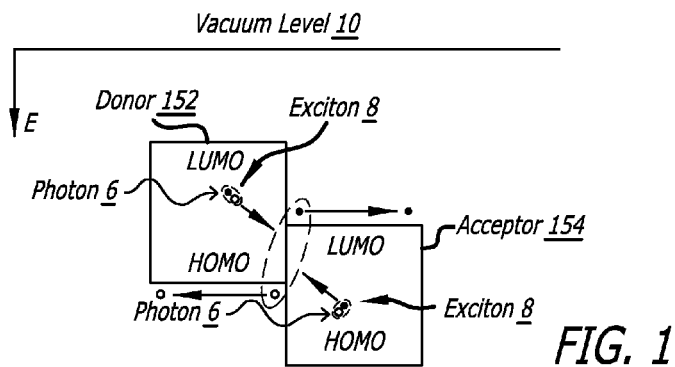
FIG. 1 is an energy level diagram illustrating a donor-acceptor heterojunction.
Figure 2:
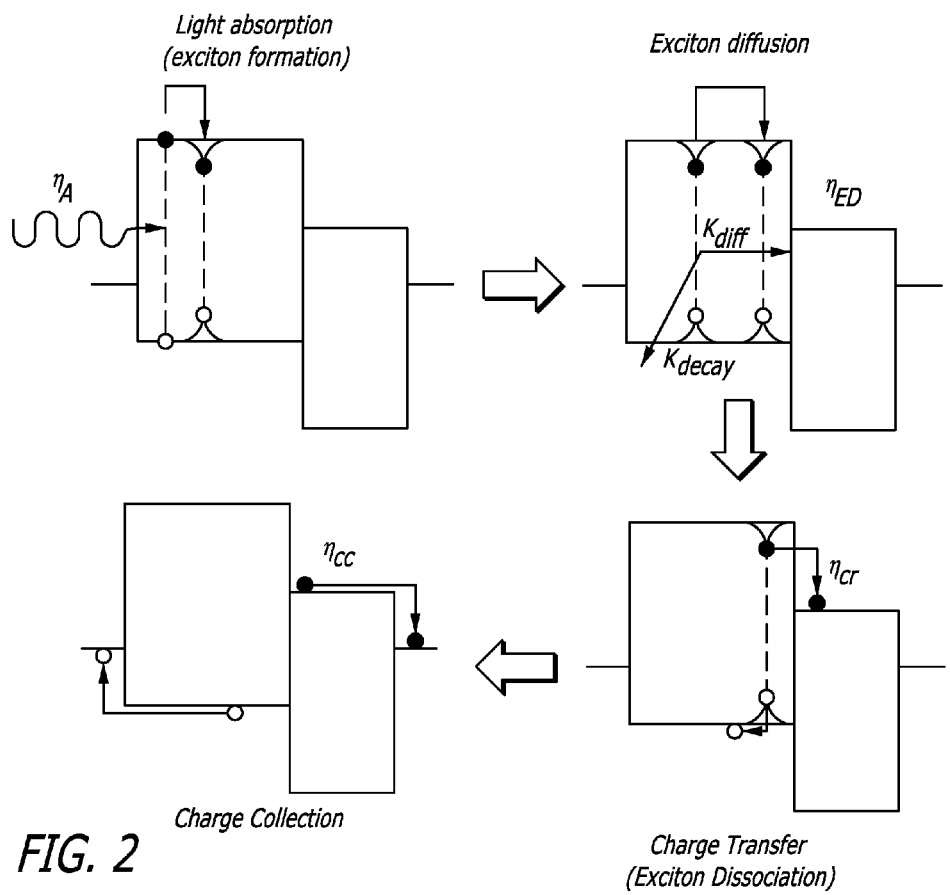
FIG. 2 shows a general mechanism for photocurrent generation in OPV cells.
Figure 3B:
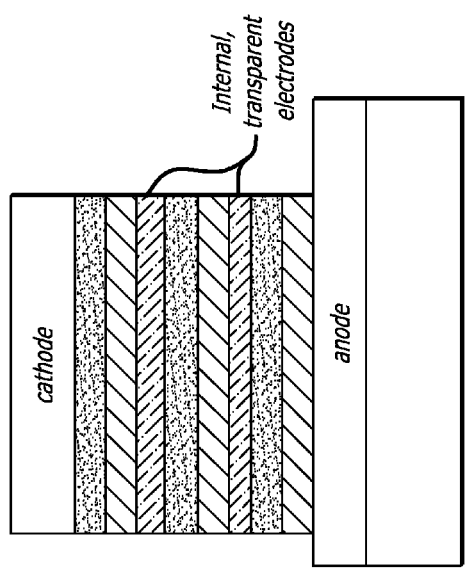
FIGS. 3A-3B show a tandem cell design in 3A and a bulk heterojunction cell in 3B, wherein the donor is shown solid cross-hatched and the acceptor is stippled in FIGS. 3A-3B, and the internal transparent electrodes are shown as broken cross-hatched, and the cathode and anode are as labeled in the FIGS. 3A-3B.
Figure 3A:
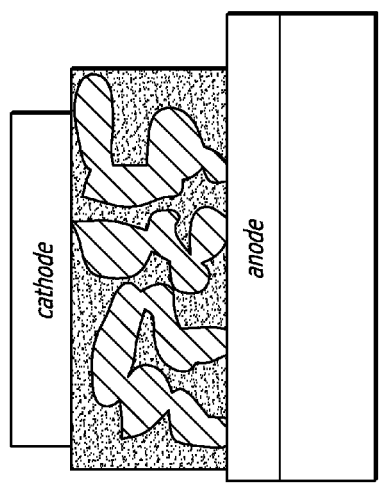

The organic photoconductive material comprising at least one singlet fission host material doped with at least one triplet forming dopant material described herein may have applications in optoelectronic devices other than organic solar cells. In one embodiment, other optoelectronic devices such as organic photodetectors, organic photosensors, organic photoconductors, chemical sensors and biological sensors may employ the nonplanar porphyrins.

As used herein, photosensitive optoelectronic devices can be solar cells, photodetectors, photosensors, photoconductors, chemical sensors, and biological sensors.

As used herein, the term "organic" includes polymeric materials as well as small molecule organic materials that may be used to fabricate organic photosensitive optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

There are a number of organic compounds that have been reported to undergo singlet fission to efficiently form two triplet excitons. Thus the absorption of a single photon could lead the formation of two excitons. If one of these materials is used as the donor or acceptor layer of an organic photovoltaic device, one could potentially realize high currents (relative to materials that do not undergo singlet fission), due to the doubling of the number of excitons that could potentially reach the D/A interface. Moreover, the fact that the excitons ultimately formed on light absorption are in the triplet states has the added benefit that triplet excitons have longer lifetimes than their singlet counterparts, potentially giving triplet exciton materials greater exciton diffusion lengths. The enhanced exciton diffusion length will allow for the use of thicker organic films and thus enhanced light collection efficiency.

In one embodiment, the present invention is directed to a method to improve singlet fission materials to give enhanced/broader light absorption, particularly into the red and near IR regions of the solar spectrum. In another embodiment, the present invention involves the doping of materials known to give significant intersystem crossing on optical excitation, such that absorption of a photon at the dopant site will efficiently from a triplet exciton at the dopant. The dopant materials being employed herein typically have small energy shifts between the absorption bands and the triplet exciton, such that the loss of the energy between the singlet excited state formed in optical excitation and the triplet is small (i.e. a small exchange energy). Metal porphyrin and phthalocyanine complexes have these characteristics, with intense "Q-bands" in the red to near IR part of the spectrum and triplet energies in the near IR. The dopant formed triplet will transfer efficiently to the singlet fission materials to be transported to the D/A interface. Thus, light absorption by either the fission materials or the dopant will give triplet excitons in the fission/host material. The absorption spectrum of the doped film will be the superposition of the spectra of the host and dopant materials, leading to a broad range of useful absorption energies. The dopant material will be chosen so that its principal absorption bands fall between the dominant absorption bands of the fission material (singlet absorption bands) and the energy of the triplet in the fission material. This will ensure the broadest possible spectral absorbance for the doped film and that the dopant triplet will have a higher energy than the host triplet. In one embodiment, the dopant materials comprise about 50% or less of the material and the host comprises about 50% or more of the film.

The singlet fission host material can be selected molecules that would potentially undergo singlet fission. In one embodiment, the singlet fission host material is selected from molecules that present intense light absorption, consisting of essentially π-conjugated systems. Molecules that would provide an efficient singlet fission can be selected using the basic strategy presented in the publication by Paci et. al. [Ref. 15], the disclosures of which are herein incorporated by reference. The selection criterion is based on the relative energetics of the S1, T1 and T2 states. First, it is necessary that the generation of the two T1 states to be slightly exoergic starting from the vibrationally relaxed excited state, so that $E(S1)>2E(T1)$. This same requirement also assures a low room-temperature rate of T1-T1 annihilation to yield S1 and S0 since it would now be endoergic. However, T1-T1 annihilation to yield the next higher triplet, T2 and S0 could be nearly isoergic and very fast. It is also then necessary to impose that $E(T2)>2E(T1)$ which will guarantee this annihilation process to be endoergic and very slow. This is also desired to reduce the likeliness of the singlet to intersystem cross into the triplet manifold. In summary, optimal singlet fission materials should satisfy the highly unusual condition: $E(S1), E(T2)>2E(T1)$.

Good examples of efficient singlet fission host materials can be found in the publication by Paci et al. [Ref. 15], which include four groups of molecules: o-xylylene derivatives, isobenzofulvene derivatives, p-xylylene derivatives and perylene derivatives. Of these families, many compounds arise as probable candidates for singlet fission based on the calculations presented in the publication by Paci et al. The disclosures of Paci et al. are herein incorporated by reference. In addition to these four groups of molecules, polythiophene (P3HT) and polyacenes such as tetracene can also be used as the singlet fission materials.

While the use of triplet excitons could have a beneficial effect on devices from an exciton diffusion standpoint, there are other aspects of the charge generation process that may not be enhanced. In particular, triplet materials have tended to be avoided due to the exchange energy losses associated with the exciton converting from a singlet to a triplet. This energy loss can be as a high as 1 eV and represents significant loss in the photon energy harvested by the device. In one embodiment, the present invention comprises dopant materials with comparatively small singlet-triplet energy differences. Thus, light absorption in the material will lead to a fairly small exchange energy loss. The singlet fission materials will of course have large singlet-triplet energy separations, since the singlet has an energy greater than twice the triplet energy (i.e. $E(S_1)>2E(T_1)$). If this is not the case, singlet fission will not occur.

There has been account of the fabrication of two OPV devices in the prior art. Yang [Ref. 13] has reported a tetracene donor OPV cell (ITO/PEDOT:PSS/tetracene/$C_{60}$/BCP/Al) and Kippelen [Ref. 14] has reported a similar device with a pentacene donor layer. Both devices give high efficiency (2.3 and 2.7%, respectively). Yang and Kippelen chose to use acene donor materials, because of their high carrier mobilities, and attribute the high PV efficiencies to good energy matching between the donor and acceptor materials, as well as long excitons diffusion lengths, due to a high level of order in the acene layers. While these factors may be important, it is likely that triplet excitons play a significant role in these devices. It has been well documented that singlet excitons in both tetracene and pentacene solid samples undergo a fission process to form two triplet excitons (i.e. $S_1+S_0 \rightarrow 2 T1$). Thus, it is likely that for every photon absorbed in the donor layer of these devices, two excitons are generated, not one. (see scheme 1 of FIG. 4) This effect is evidenced by the fact that the optimized thickness of the donor tetracene layer in Yang's paper is as high as 800 Å, which is much higher than any thickness reported so far for a typical small molecule OPV. [Ref. 13] A longer exciton diffusion length would allow for this observed optically dense thick photoactive layer as was mentioned before.

The likely presence of an elongated exciton diffusion length is very probably a result of the presence of singlet fission mechanism creating two triplets from one singlet exciton, producing excitons that have a longer lifetime than singlets, even on the solid sample. Singlet fission is known to occur as long as it is true that $E(S1) > 2E(T1)$ and it offers the advantage that it usually happens without appreciable loss of energy compared to those losses experienced during intersystem crossing decay into the triplet since $E(S1) \approx 2E(T1)$ for tetracene and for a various other systems. An extra added benefit of singlet fission occurring in solar cells is the generation of doubled the amount of excitons generated upon light absorption for a specific photon energy which would ideally generate doubled amount of carriers by splitting once they reach the D-A interface.

It is also known that the stacking and arrangement of tetracene molecules in films is very efficient and very likely results in layers organized enough to permit an enhanced diffusion coefficient. The outcome of the combination of these effects, high exciton lifetime and enhanced diffusion coefficient, results in a longer exciton diffusion length and therefore permits the use of more extensive layers capturing light more efficiently.

It is the case for example of the metallo-porphyrin, Pt(TPBP) (Platinum tetraphenyl tetrabenzoporphyrin). Pt(TPBP) has been tested in OPVs as donor layer and showed great performance making it a suitable donor material for solar cell applications. Due to the extensive π system of the porphyrin it is observed that the absorption coefficient is high for the visible part of the spectrum. A very interesting feature of metallo-porphyrins is their high intersystem crossing yielding complete conversion from the singlet into the triplet state. The high Isc efficiency is due in large part to the high spin-orbit-coupling of the heavy metal core of this complex. The triplet state is known to be very long lived, ~53 μs for a diluted solution of this molecule. Still, the problem of the small exciton diffusion length remains on the fabrication of solar cells by limiting the thickness of donor to be used and therefore the amount of light to be absorbed.

It is known that the triplet lifetime may be diminished on a solid sample due to quenching, excimer formation and T-T annihilation. However it should still remain higher that that of singlet excitons on a solid matrix. The fact that the optimized thickness of Pt(TPBP) as donor layer is around 150 Å, very similar as those found for other non triplet materials, suggests that the diffusion coefficient might be deficient so that multiplied by a higher exciton lifetime it would yield a similar value of $Ld^2$ as those found for non-triplet materials. This low diffusion coefficient might be a result of a poor π-stacking of the film that reduces the possibility of the characteristic exciton Dexter transfer for triplet molecules. The non-planarity of the molecule prevents close contact between near neighbors impeding successful exciton hoping.

Even though the systems presented above are good candidates for solar cell materials, they both introduce some weakness in the effort of optimizing light absorption and exciton transport into the D/A interface. Acenes have good π-stacking providing an enhanced exciton and carrier transport and moderately efficient singlet fission that may account for the creation of long lived triplet excitons but its absorbance does not extend into the red part of the spectrum. Metallo-porphyrins on the other hand have high absorption coefficients in the red and near IR part of the spectrum, excellent triplet generation but poor transport ability. These two systems combined could overcome each other's problem providing an excellent host-dopant ensemble for solar cell applications by giving a material with a highly enhanced exciton diffusion length.

The advantage of this combination of molecules is to minimize energy losses and to provide a material consisting of mainly triplet states upon light absorption in the hope of obtaining long exciton diffusion lengths. By doping into an acene matrix layer, metallo-porphyrin molecules will absorb into the singlet state and very efficiently convert into the triplet state due to its high intersystem crossing, with very little energy loss, due to the small exchange energy difference between the S1 and T1 in these materials. This triplet is thought to not diffuse extensively within pure porphyrin matrix, but given that the porphyrin is only diluted into the acene, it can rapidly transfer the excitation to the acene host (see scheme 2 of FIG. 4B). For tetracene for example, the triplet state is close to 1.2 eV whereas the Pt(TPBP)s triplet is at 1.68 eV, allowing for exothermic transfer of the porphyrin triplet to the tetracene material. The tetracene now will be highly populated into the triplet excited state and it is anticipated it would have a large diffusion coefficient that together with a very long lived exciton it would result in a highly elongated exciton diffusion length. In this approach, the dopant excitons will be transferred to the tetracene and diffuse to the D/A interface for separation, using the acene for both exciton and carrier conduction.

From the point of view of the singlet fission material, when light is absorbed, a singlet state is formed. This singlet state will either undergo singlet fission, giving two triplets, or it could also be quenched by the singlet state of the porphyrins which are typically lower in energy than the acene singlet (see scheme 3 of FIG. 4C). Consequently, it will then follow the recently explained intersystem crossing pathway into the triplet and subsequently regained back by the acene triplet. This process will lead to a triplet exciton, but not the two triplets that would be formed by the fission process. At suitably low dopant concentrations this process can be minimized.

In the effort of designing molecules with the right energetics to provide for efficient energy transfer into the triplet state of the host material, one has to keep in mind that the best combination of molecules will be the one that provides the most favorable spectral overlap. The absorption spectra of both families should not overlap markedly, but have the dopant absorbance bands fill between the singlet absorbance bands of the fission/host material and the triplet energy of the fission/host material.

Figure 4A:
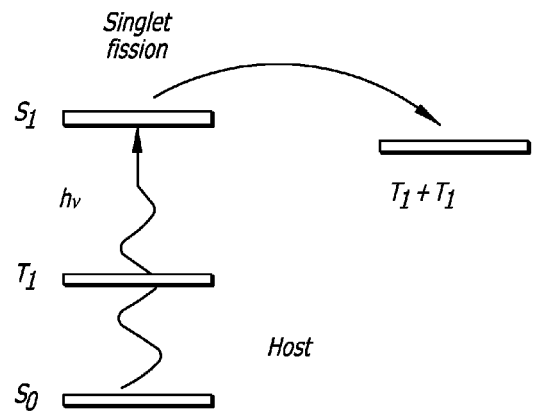
FIGS. 4A-4D show the singlet fission energetics in Scheme 1 (FIG. 4A); dopant triplet quenching into the triplet state of the host in Scheme 2 (FIG. 4B); quenching of host singlet by donor singlet and further conversion and transfer into the triplet of the host in Scheme 3 (FIG. 4C); and overall process of enhanced triplet creation on the host in Scheme 4 (FIG. 4D).
Figure 4B:
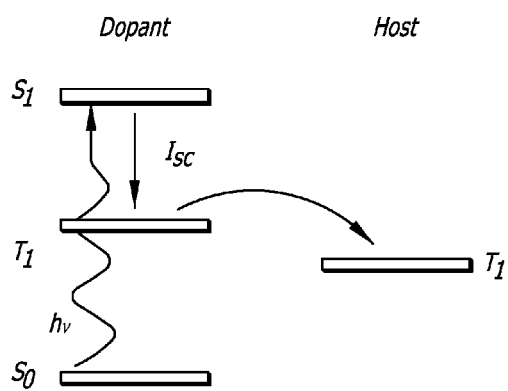
Figure 4C:
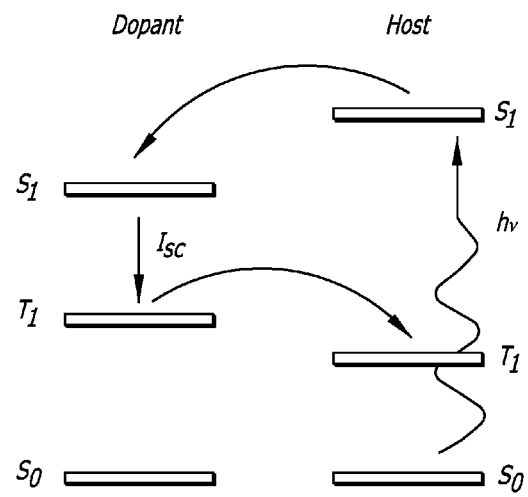
Figure 4D:
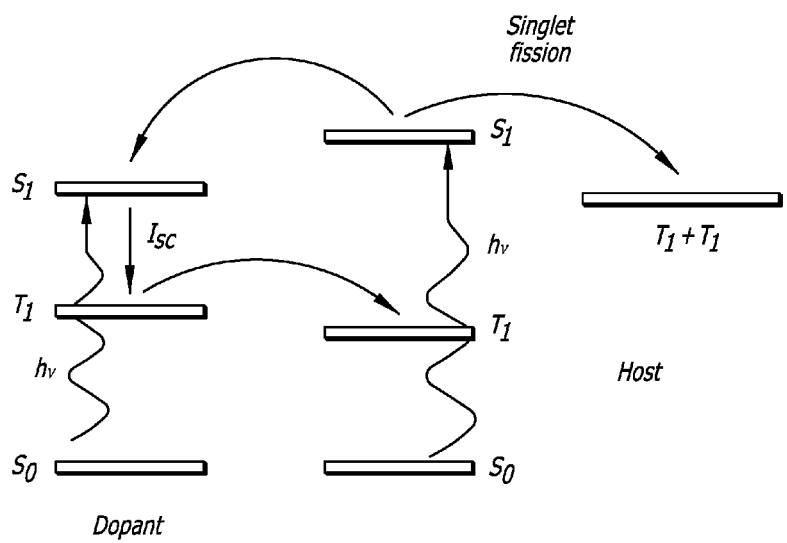

A large number of different compounds have been reported that demonstrate singlet fission, this will give the ability to screen for the desired intermolecular interactions within these materials as well as with the dopant molecules. It is desired to use those molecules that show ordering and stacking necessary to provide with good diffusion coefficients that will enhance exciton diffusion length. Also, it is key to find the right combination of host-dopant materials that would provide energetically favoring systems both for minimizing the energy losses during the formation of triplets and that offer the right cascade effect for energy transfer between molecules, see scheme 4 (FIG. 4D). In addition, it is highly desired to design materials that will show a reduced rate of T-T annihilation. This effect is highly detrimental for a good cell performance since excitons may annihilate before they reach the D/A interface and charge separate, markedly reducing light collection.

The OPV cells of the present invention have a structure similar to those of the small molecule based devices described elsewhere, with the donor layer replaced with a singlet fission host material doped with a triplet forming dopant (such as a heavy metal based porphyrin).

In one embodiment, the present invention relates to an organic photosensitive optoelectronic device comprising an anode, a cathode, and at least one photoactive region disposed between the anode and cathode wherein:

the at least one photoactive region comprises at least one organic photoconductive material comprising at least one singlet fission host material and at least one triplet forming dopant material;

the amount of the at least one singlet fission host material is greater than the amount of the at least one triplet forming dopant material;

the at least one singlet fission host material is selected from a material that exhibits singlet fission when light is absorbed;

and the at least one triplet forming dopant material forms a triplet exciton after light is absorbed by the dopant.

In another embodiment, the at least one singlet fission host material satisfies the condition of E(S1), E(T2)>2E(T1). In a further embodiment the at least one singlet fission host material is selected from o-xylylene, p-xylylene, isobenzofulvene, perylene, polythiophene and polyacenes, such as tetracene, p-sexiphenyl, tetracyano-p-quinodimethane, tetrafluoro tetracyano-p-quinodimethane, polydiacetylene, poly(p-phenylene), poly(p-phenylenevinylene), carotenoids, 1,4-bis(tetracen-5-yl)benzene. In one embodiment, the at least one singlet fission host material is selected from the following compounds:

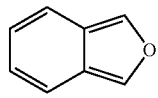
1

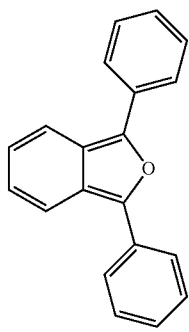
2

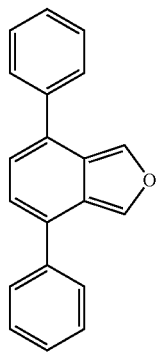
3

-continued

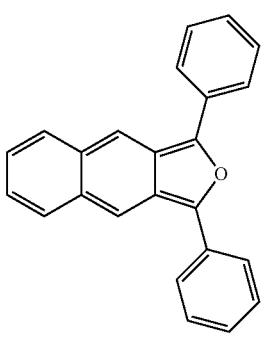
4

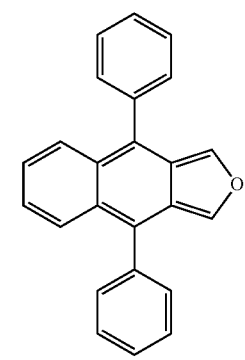
5

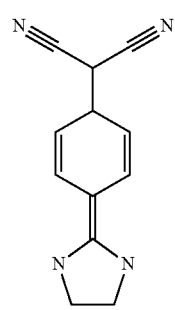
6

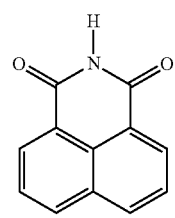
7

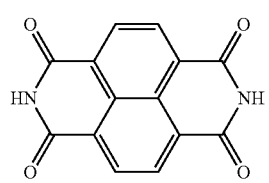
8

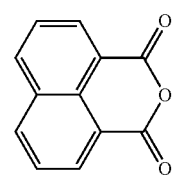
9

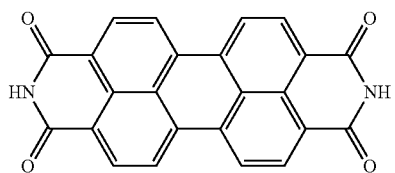
10
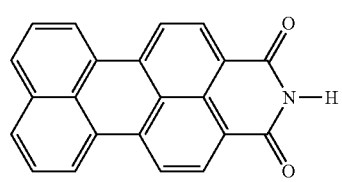
11
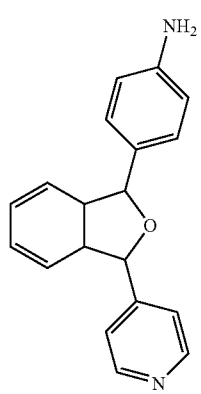
12
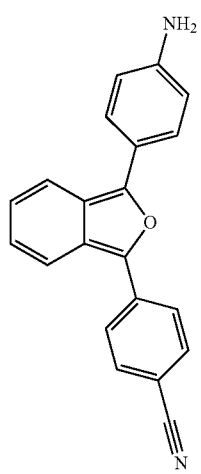
13
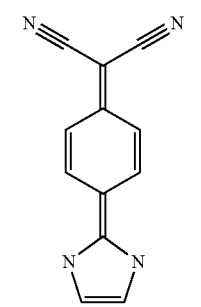
14
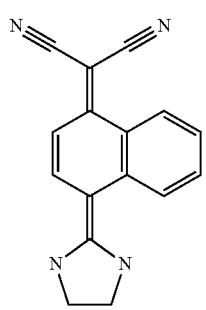
15
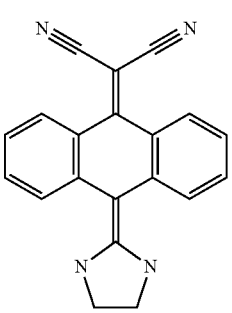
16
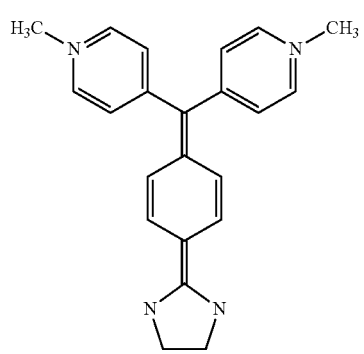
17
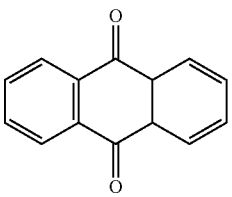
18
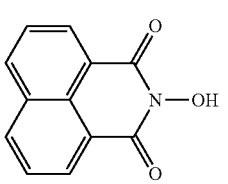
19
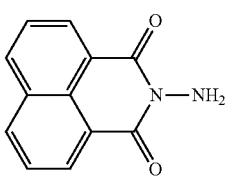
20

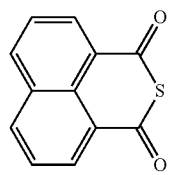 21
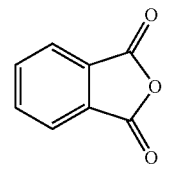 22
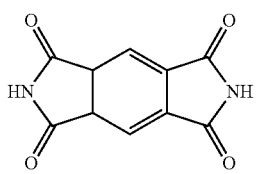 23
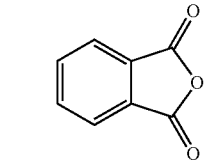 24
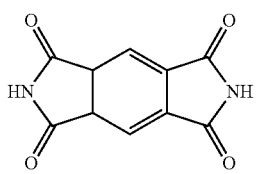 25
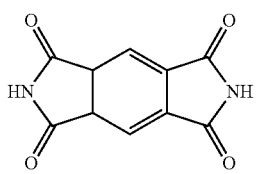 26
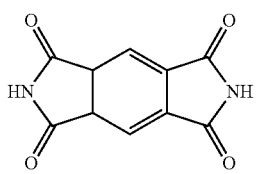 27
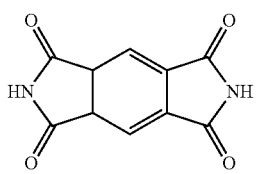 28
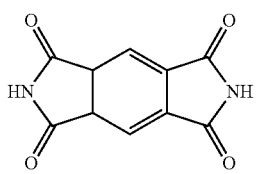 29
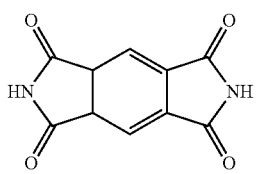 30
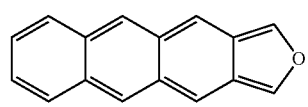 31
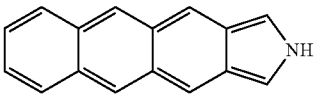 32
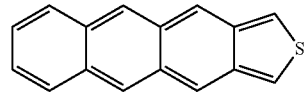
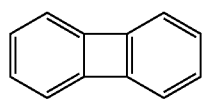 33
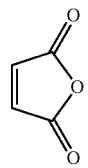 34
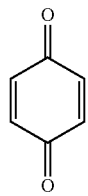 35
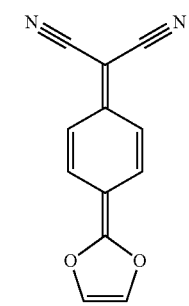 36
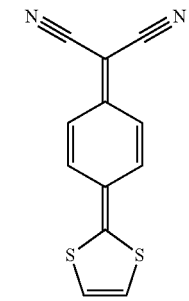 37
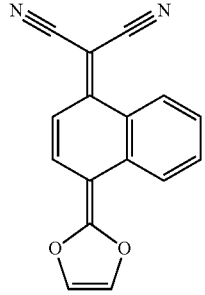 38
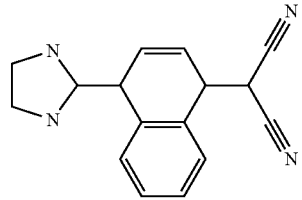 39

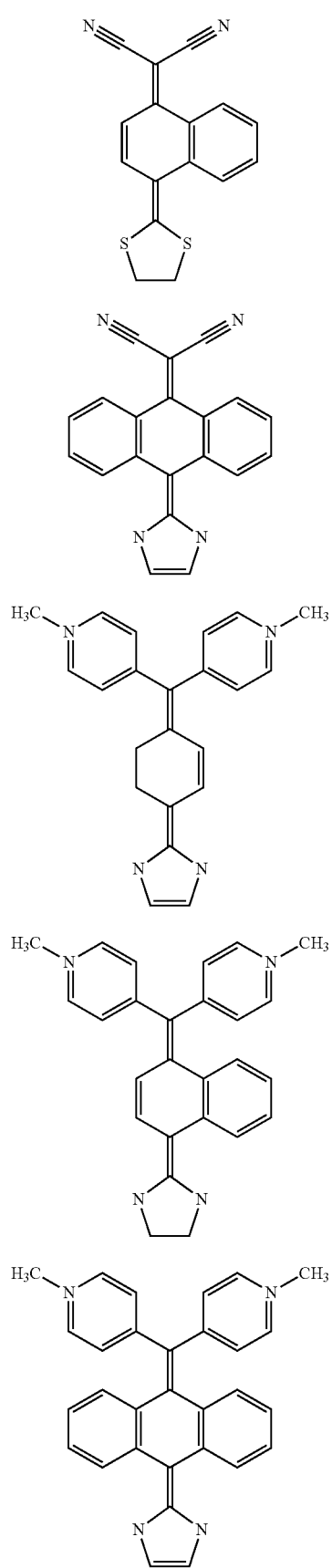
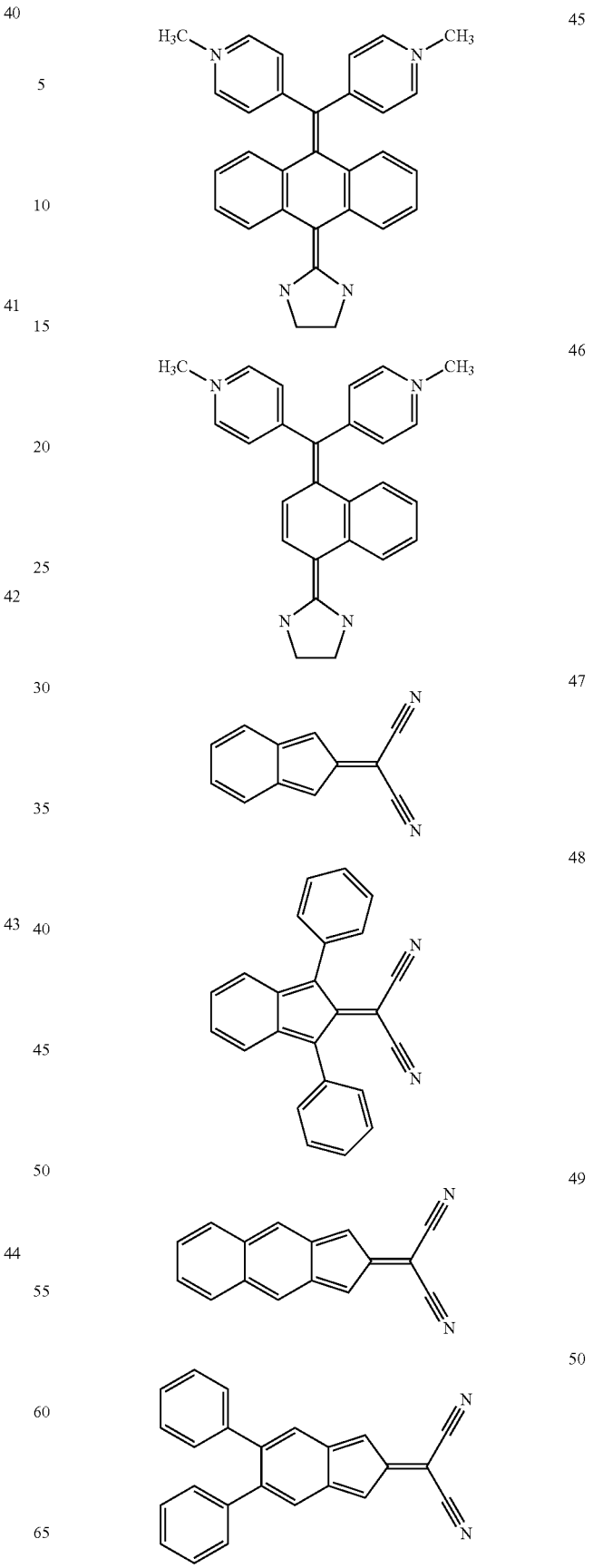

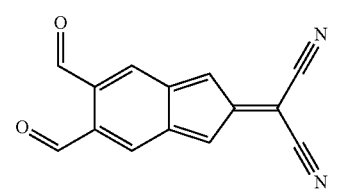 51
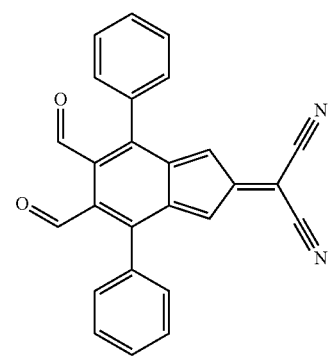 52
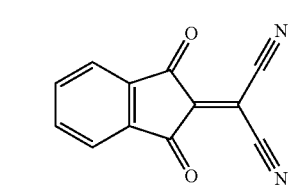 53
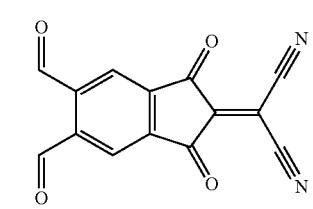 54
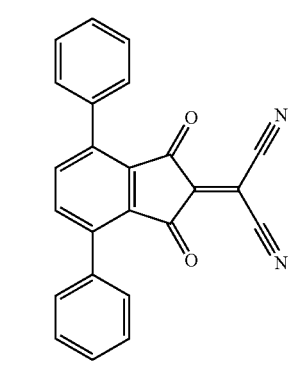 55
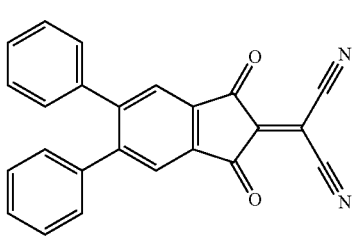 56
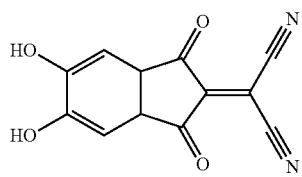 57
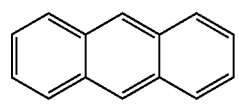 58
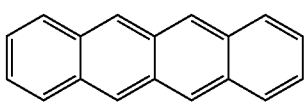 59
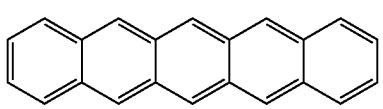 60
 61
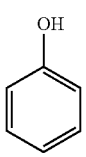 62
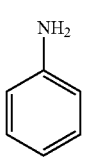 63
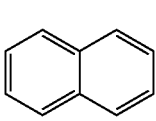 64
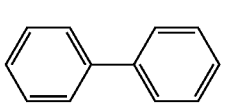 65
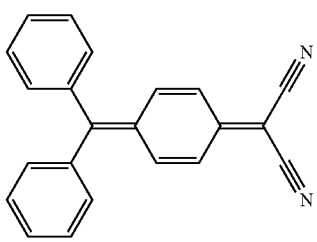 66
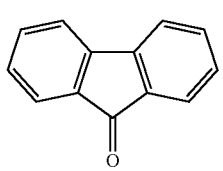 67

-continued

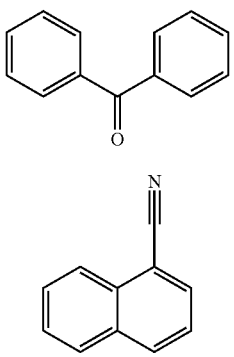

68

69

In another embodiment, the at least one singlet fission host material is selected from the group consisting of anthracene, tetracene and pentacene. In a further embodiment, the at least one singlet fission host material is selected from crystalline anthracene, crystalline tetracene, and crystalline pentacene.

In another embodiment, the at least one triplet forming dopant material has a higher triplet energy than that of the at least one singlet fission host material. In another embodiment, the at least one triplet forming dopant material has a small singlet-triplet gap, for example a singlet-triplet gap of less than about 0.5 eV. In one embodiment, the triplet forming dopant material has the right energetics relative to the singlet fission host material so that the dopant material's triplet will transfer exothermically to the triplet of the singlet fission host material. Examples of the triplet forming dopant material that can be used in the devices of the present invention can be, but are not limited to porphyrins and phthalocyanines. In another embodiment, a triplet forming dopant material other than a porphyrin or phthalocyanine complex will work in the devices of the present invention.

In one embodiment, the at least one triplet forming dopant material absorbs light in the red and near IR regions of the solar spectrum.

In another embodiment, the at least one triplet forming dopant material is selected from porphyrin compounds and phthalocyanine complexes.

In another embodiment, the at least one triplet forming dopant material is at least one porphyrin compound.

In another embodiment, the at least one porphyrin compound is nonplanar.

In another embodiment, the at least one nonplanar porphyrin is selected from compounds having formula (I),

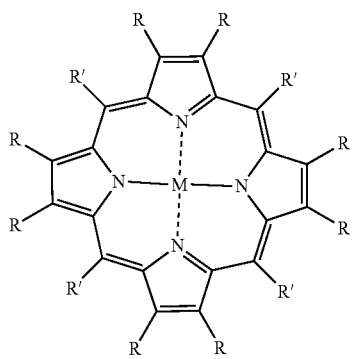

(I)

wherein
M is selected from Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Si, Ge, Sn, Pb, P, As, Sb, Bi, S, Se, Te, Po, Cl, Br, I, At, lanthanides, actinides, and 2H;
R' is independently selected from Cl, Br, I, At, and a group comprising a valence atom attached to the meso carbon of the porphyrin, wherein the valence atom is selected from B, C, N, O, Si, P, S, Cl, Ge, As, Se, Br, In, Sn, Sb, Te, I, Tl, Pb, Bi, Po and At; and
R is independently selected from Cl, Br, I, At, and a group comprising a valence atom attached to a β carbon of a pyrrole ring, wherein the valence atom is selected from B, C, N, O, Si, P, S, Cl, Ge, As, Se, Br, In, Sn, Sb, Te, I, Tl, Pb, Bi, Po and At, wherein two adjacent R groups attached to the same pyrrole ring together with the two β carbons of the pyrrole ring may form a carbocyclic group or heterocyclic group.

As shown in Formula I, 2H comprise the two non-covalently linked nitrogen atoms (shown with dashed lines) that have hydrogen atoms.

In another embodiment, the valence atom in at least one R' or R group is C.

In one embodiment, the at least one R' or R group is independently selected from an alkyl group, substituted alkyl group, alkenyl group, substituted alkenyl group, alkynyl group, substituted alkynyl group, cycloalkyl group, substituted cycloalkyl group, cycloalkenyl group, substituted cycloalkenyl group, cycloalkynyl group, substituted cycloalkynyl group, aryl group, substituted aryl group, heterocyclic group and substituted heterocyclic group.

In another embodiment,
the substituted alkyl group is substituted with at least one radical independently selected from cycloalkyl groups, cycloalkenyl groups, cycloalkynyl groups, aryl groups, heterocyclic groups, hydroxy groups, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl group, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro groups, heterocyclic groups and halogen atoms;
the substituted alkenyl group is substituted with at least one radical independently selected from cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl- N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted alkynyl group is substituted with at least one radical independently selected from cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkenyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkynyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino optionally groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted aryl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms; and the substituted heterocyclic group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms.

In one embodiment, the two adjacent R groups of at least one pyrrole ring together with the two β carbon atoms of the at least one pyrrole ring form a carbocyclic group, substituted carbocyclic group, heterocyclic group, or substituted heterocyclic group. In another embodiment, the two adjacent R groups of the at least one pyrrole ring together with the two β carbon atoms of the at least one pyrrole ring form a carbocyclic group or substituted carbocyclic group.

In one embodiment, the carbocyclic group or substituted carbocyclic group is a macrocycle or benzanulated π-system.

In one embodiment, the carbocyclic group or substituted carbocyclic group is aromatic.

In another embodiment, the two adjacent R groups of the at least one pyrrole ring together with the two β carbon atoms of the at least one pyrrole ring form a heterocyclic group or substituted heterocyclic group.

In one embodiment, the heterocyclic group or substituted heterocyclic group is aromatic.

In one embodiment, the at least one R' or R group is phenyl, tolyl, xylenyl, mesityl, methyl, ethyl, n-propyl or isopropyl.

In one embodiment, the at least one nonplanar porphyrin is selected from the following compounds:

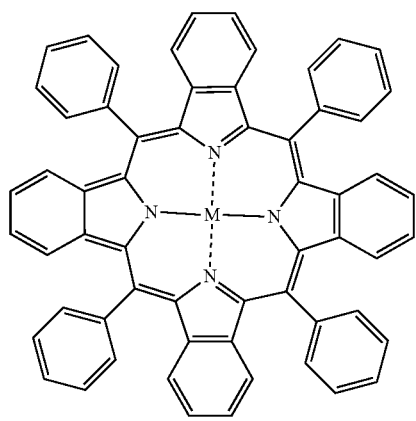

1

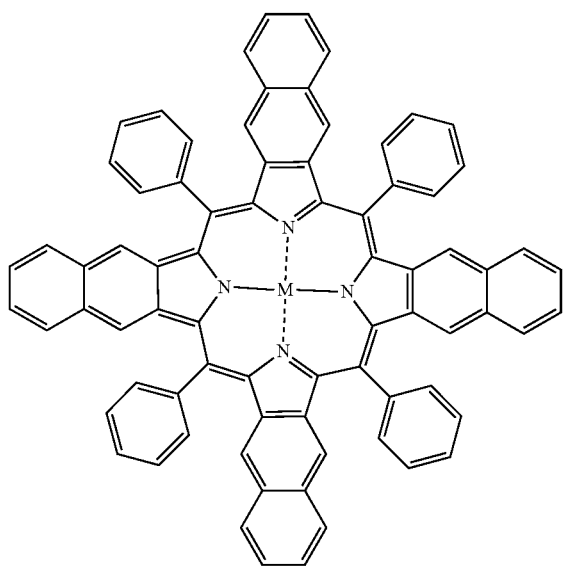

2

-continued

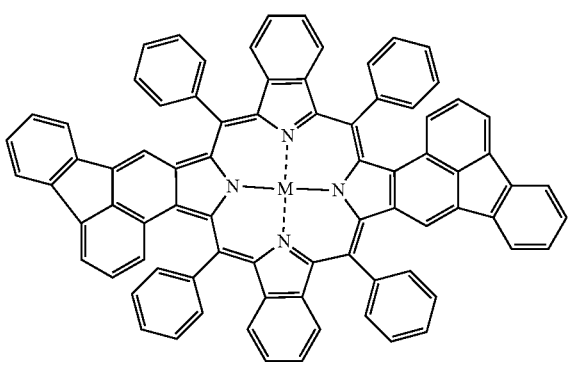

3

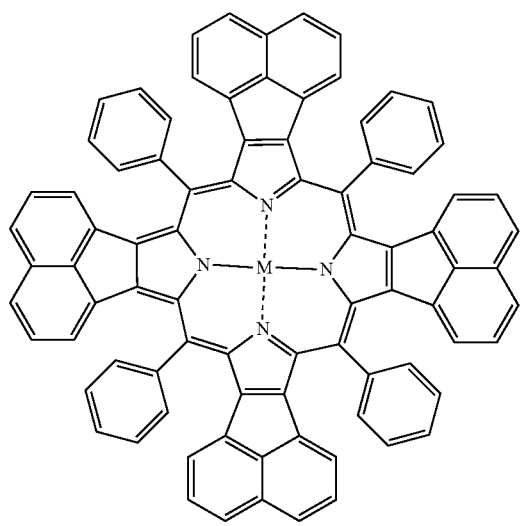

4

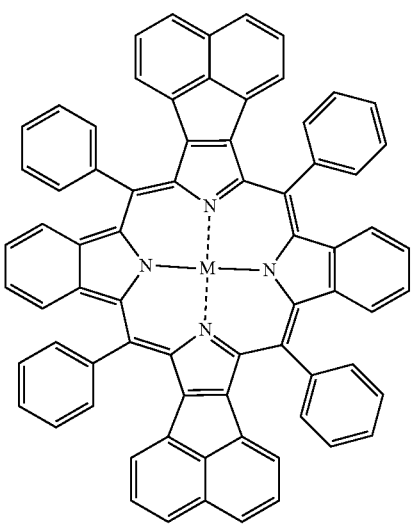

5

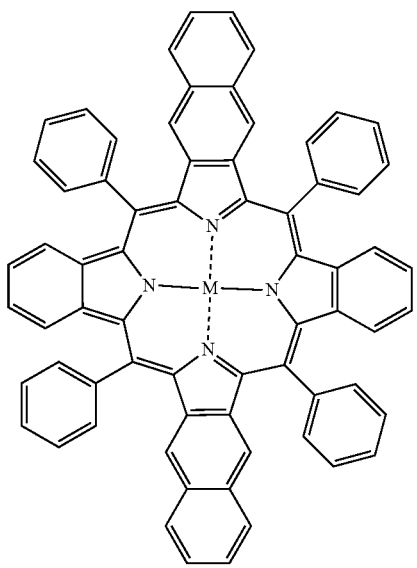

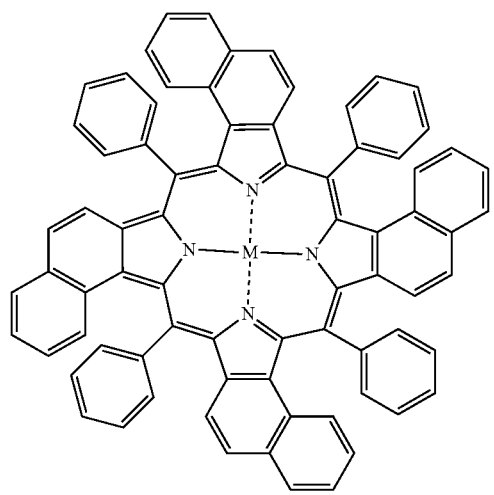

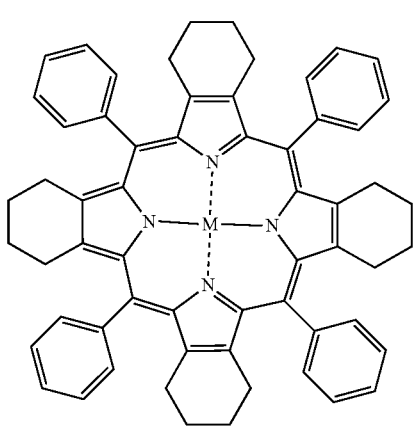

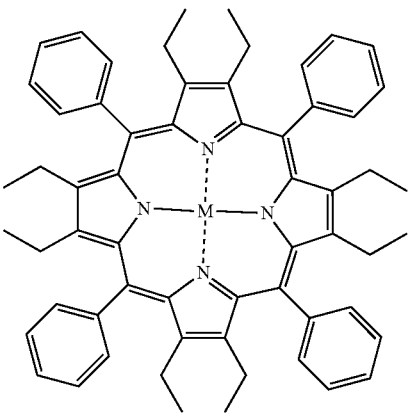

In one embodiment, the valence atom in at least one R' or R group is O.

In another embodiment, the at least one R' or R group having O as the valence atom is hydroxy, alkoxy, alkenyloxy, alkynyloxy, cycloakoxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy.

In a further embodiment, the at least one R' or R group having O as the valence atom is hydroxy or alkoxy.

In a further embodiment, the at least one R or R' group having O as the valence atom is OH, methoxy, ethoxy, n-propoxy or isopropoxy.

In one embodiment, at least one R or R' group is independently selected from Cl, Br, I, and At.

In another embodiment, at least one R or R' group has N as the valence atom.

In one embodiment, the at least one R or R' group having N as the valence atom is selected from an amino group, alkylamino groups, dialkylamino groups, alkenylamino groups, dialkenylamino groups, alkynylamino groups, dialkynylamino groups, N-alkyl-N-alkenylamino groups, N-alkyl-N-alkynylamino groups, N-alkenyl-N-alkynylamino groups, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups comprising a nitrogen valence atom and substituted heterocyclic groups comprising a nitrogen valence atom.

In one embodiment, at least one R or R' group has S as the valence atom.

In one embodiment, the at least one R or R' group comprising S as the valence atom is selected from a thiol group, alkylthio groups, alkenylthio groups, alkynylthio groups, aralkylthio groups, aralkenylthio groups, aralkynylthio groups, cycloalkylalkylthio groups, cycloalkenylalkylthio groups, cycloalkynylalkylthio groups, cycloalkylthio groups, cycloalkenylthio groups, cycloalkynylthio groups, and arylthio groups.

In one embodiment, M is Pt, Pd, or Ir.
In another embodiment, M is Pt.
In another embodiment, M is Pd.
In one embodiment, the at least one nonplanar porphyrin is Pt(tetraphenyl benzo-porphyrin).
In another embodiment, the at least one nonplanar porphyrin is Pd(tetraphenyl benzo-porphyrin).

In one embodiment, the device is an organic photovoltaic cell.

In another embodiment, the device is a photoconductor cell.

In another embodiment, the device is a photodetector.

In one embodiment, the device is selected from organic photosensors, chemical sensors and biological sensors.

Definitions

As used herein, "carbocyclic group" means a cyclic chemical group wherein all the ring atoms are carbon. The "carbocyclic group" is monocyclic or multicyclic. The "carbocyclic group" can be a cycloalkyl group, cycloalkenyl group, cycloalkynyl group and aryl group.

As used herein, "heterocyclic group" refers to a cyclic chemical group having at least one N, O or S ring atom, with C atom(s) as the remaining ring atom(s). The "heterocyclic group" is monocyclic or multicyclic. When the "heterocyclic group" is aromatic, it is called a "heteroaryl group." The heterocyclic group can be a cyclic group comprising a 4-, 5-, 6-, 7- or 8-membered ring, wherein the ring comprises at least one ring atom selected from the group consisting of N, O and S with C as the remaining ring atom(s). Examples of the heterocyclic group include pyrrolidinyl group, piperidinyl group, piperazinyl group, morpholino group, thiomorpholino group, homopiperidinyl group, chromanyl group, isochromanyl group, chromenyl group, pyrrolyl group, furanyl group, thienyl group, pyrazolyl group, imidazolyl group, furazanyl group, oxazolyl group, isoxazolyl group, thiazolyl group, isothiazolyl group, pyridyl group, pyridazinyl group, pyrimidinyl group, pyrazinyl group, pyranyl group, indolyl group, isoindolyl group, indazolyl group, purinyl group, indolizinyl group, quinolinyl group, isoquinolinyl group, quinazolinyl group, pteridinyl group, quinolizinyl group, benzoxazinyl group, carbazolyl group, phenazinyl group, phenothiazinyl group and phenanthridinyl group.

As used herein, when the term "monocyclic" is used to modify "carbocyclic group" or "heterocyclic group", the carbocyclic group or heterocyclic group comprises only a single ring.

As used herein, when the term "multicyclic" is used to modify "carbocyclic group" or "heterocyclic group", the carbocyclic group or heterocyclic group comprises at least two rings. Examples of "multicyclic" include bicyclic, tricyclic and tetracyclic. Some or all of the rings in the "multicyclic" group can be peri-fused, ortho-fused and/or bridged. The "multicyclic" group can be a spiro group.

As used herein, a "valence atom" of a chemical group refers to the atom of the chemical group that attaches to another chemical group or atom.

As used herein, the term "hydrocarbyl group" refers to a chemical group having carbon and hydrogen atoms.

As used herein, the term "alkyl group" means a straight-chain or branched saturated hydrocarbyl group. Preferably, the "alkyl group" is C1-C6. Examples of the alkyl group include methyl, ethyl, n-propyl, isopropyl, n-butyl, sec-butyl, isobutyl, tert-butyl, n-pentyl and n-hexyl.

As used hereon, the term "alkenyl group" means a hydrocarbyl group comprising at least one C=C double bond. Preferably, the "alkenyl group" is $C_2$-$C_6$. An example of the alkenyl group is vinyl.

As used herein, the term "alkynyl group" means a hydrocarbyl group comprising at least one carbon-to-carbon triple bond. The term "alkynyl group" includes a chemical group having at least one carbon-to-carbon triple bond and at least one C=C double bond. Preferably, the "alkynyl group" is $C_2$-$C_6$.

As used herein, the term "cycloalkyl group" means a saturated cyclic hydrocarbyl group. The "cycloalkyl group" is monocyclic or multicyclic. The "cycloalkyl group" can be $C_3$-$C_8$. Examples of "cycloalkyl group" include cyclobutyl, cyclopentyl, cyclohexyl, cycloheptyl, cyclooctyl and cyclononyl.

As used herein, the term "cycloalkenyl group" means an unsaturated cyclic hydrocarbyl group having at least one C=C double bond. The "cycloalkenyl group" is monocyclic or multicyclic. The "cycloalkenyl group" can be $C_3$-$C_8$.

As used herein, the term "cycloalkynyl group" means an unsaturated cyclic hydrocarbyl group having at least one carbon-to-carbon triple bond. The "cycloalkynyl group" is monocyclic or multicyclic. The "cycloalkynyl group" can be $C_3$-$C_8$.

As used herein, the term "aryl group" means an aromatic hydrocarbyl group. The "aryl group" is monocyclic or multicyclic. The "aryl group" can be $C_6$-$C_{10}$. Examples of the "aryl group" include phenyl group and naphthyl group.

As used herein, the term "aralkyl group" refers to an alkyl group substituted with at least one aryl group. The aryl portion of the "aralkyl group" can be $C_6$-$C_{10}$. The alkyl portion of the "aralkyl group" can be $C_1$-$C_6$. Example of the "aralkyl group" are benzyl group, i.e., phenylmethyl group, and 2-phenylethyl group.

As used herein, when a chemical group is modified by "substituted" that means the chemical group has at least one hydrogen atom replaced by a substituent. Examples of the substituent include a radical selected from the group consisting of alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms.

EXAMPLES

The specific compounds of which the synthesis is described below are intended to further illustrate the invention in more detail, and therefore are not deemed to restrict the scope of the invention in any way. Other embodiments of the invention will be apparent to those skilled in the art from consideration of the specification and practice of the invention disclosed herein. It is thus intended that the specification and examples be considered as exemplary only.

General Pyrrole Synthesis (Barton-Zard Reaction)

Substituted vinyl nitro compounds may be reacted under normucleophilic basic conditions with ethyl isocyano acetate to form carboxyl ester substituted pyrrole derivatives. The carboxyl ester substituted pyrrole derivatives may then be decarboxylated under basic conditions to yield the pyrrolic moiety.

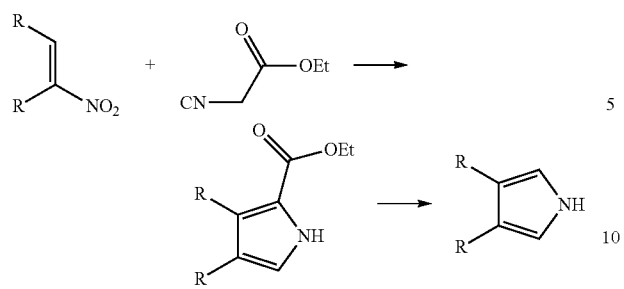

General Porphyrin Synthesis (Compounds 1-9)

Substituted pyrroles are reacted with a substituted aldehyde under Lindsey conditions with subsequent oxidation to form the 2H-porphyrin. Metallation with for example a metal halide yields the metallated porphyrin. M in the reaction scheme below is a metal.

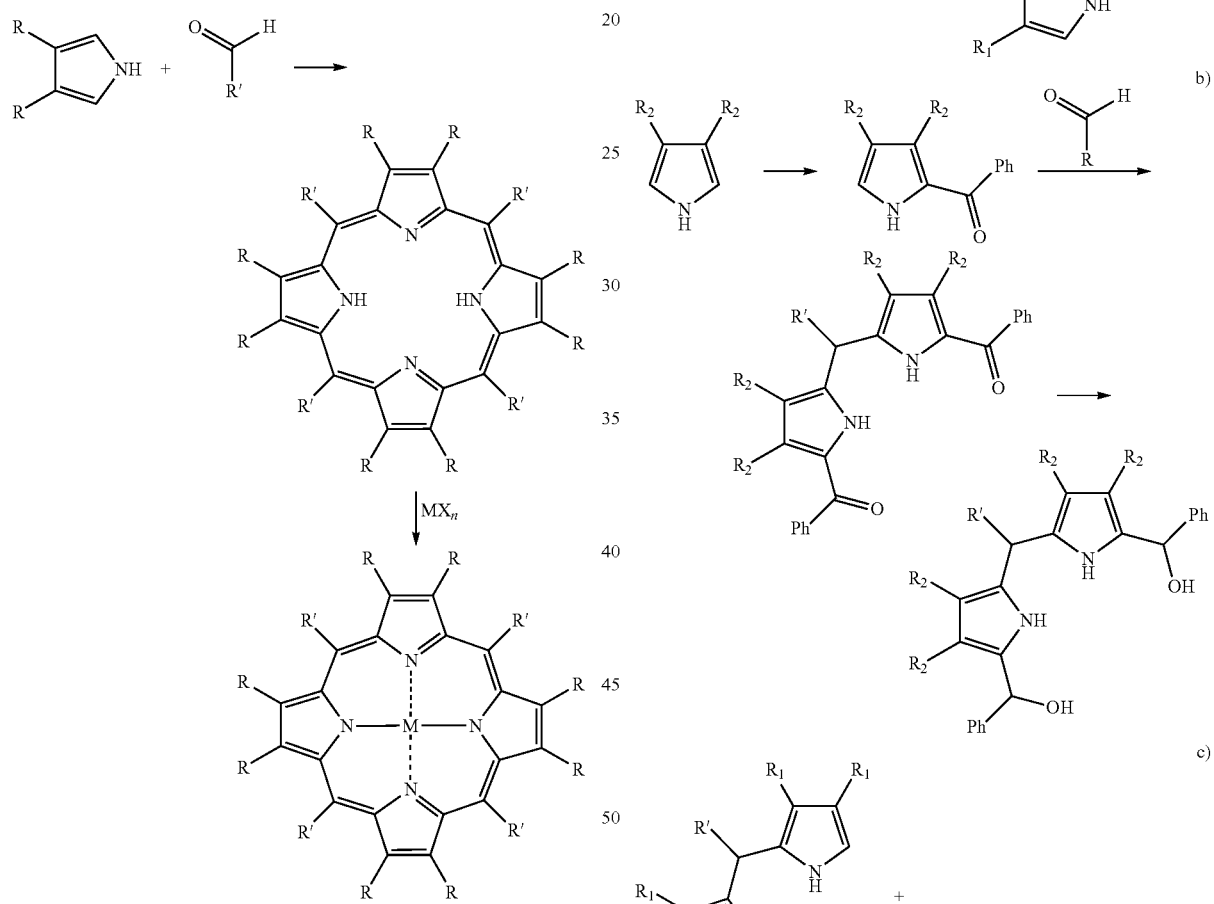

General Synthesis of cis-Substituted Porphyrin:

a) A carboxyl ester protected substituted pyrrole is condensed with a substituted aldehyde to form a dipyrromethane under Lindsey conditions with subsequent decarboxylation under basic conditions.

b) A substituted pyrrole is acylated with benzoyl chloride under Friedel-Crafts conditions and condensed with a substituted aldehyde to form a phenyl ketone substituted dipyrromethane. This phenyl ketone substituted dipyrromethane is reduced with $NaBH_4$ to the corresponding secondary alcohol.

c) The two dipyrromethane moieties prepared in pathways a) and b) are condensed under acidic conditions and oxidized to form a porphyrin and metallated. M in the reaction scheme below is a metal. $R_1$ and $R_2$ are examples of R.

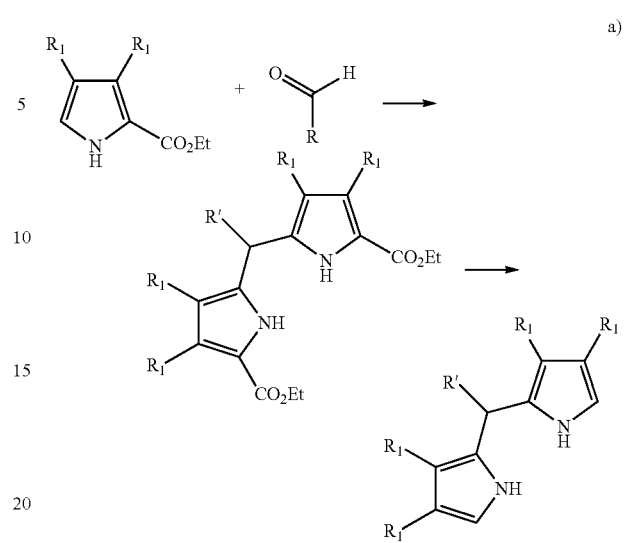

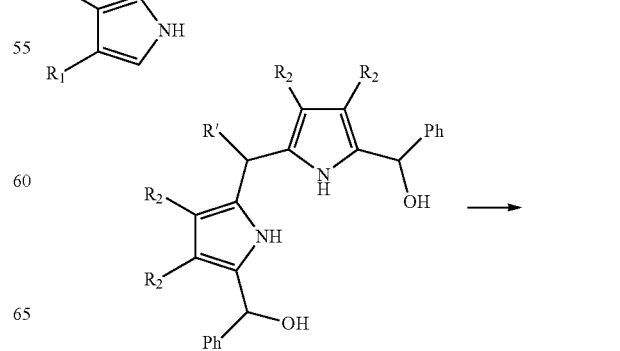

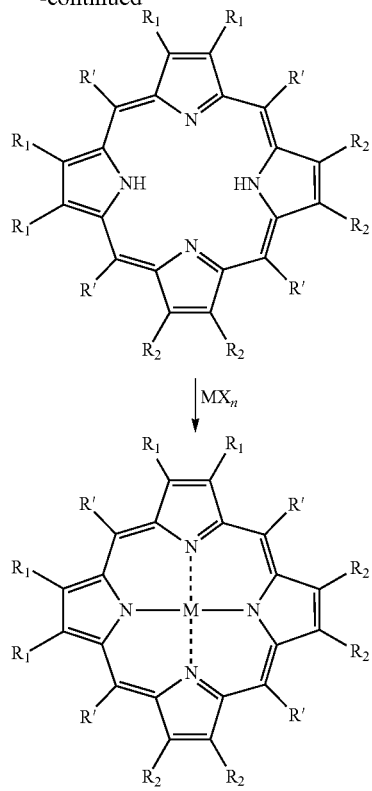

General Synthesis of trans-Substituted Porphyrin:

A substituted pyrrole is reacted with phenyl-1,3-benzoxathiolylium tetrafluoroborate to form a disubstituted pyrrole. Subsequent quenching with mercury oxide yields the ketone derivative which gets reduced using NaBH$_4$ to form the secondary alcohol. This alcohol reacts under acidic conditions with a different substituted pyrrole to form the porphyrin after oxidation. Metallation using for example a metal halide yields the final product. M in the reaction scheme below is a metal. R$_1$ and R$_2$ are examples of R.

General Synthesis of 3-1-Substituted Porphyrin:

a) A substituted pyrrole is reacted with phenyl-1,3-benzoxathiolylium tetrafluoroborate to form a disubstituted pyrrole. Subsequent quenching with mercury oxide yields a ketone derivative of pyrrole (a bis-2,5-acylated pyrrole), which is reduced using NaBH$_4$ to form a secondary alcohol substituted pyrrole.

b) This secondary alcohol substituted pyrrole is condensed with a substituted carboxylic acid ester protected pyrrole to form a bis-1,3-(pyrrolylmethyl)pyrrole protected with carboxylic ester groups, which are removed under basic conditions in the next step.

c) A differently substituted pyrrole is reacted with phenyl-1,3-benzoxathiolylium tetrafluoroborate to form a disubstituted pyrrole. Subsequent quenching with mercury oxide yields a ketone derivative of pyrrole, which is reduced using NaBH$_4$ to form a secondary alcohol substituted pyrrole.

d) Condensation of the compound prepared in b) and c) under acidic conditions yields the porphyrin after subsequent oxidation. Metallation yields the final porphyrin. M in the reaction scheme below is a metal. R$_1$ and R$_2$ are examples of R.

a)

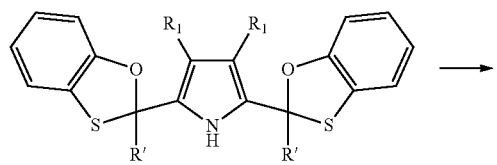

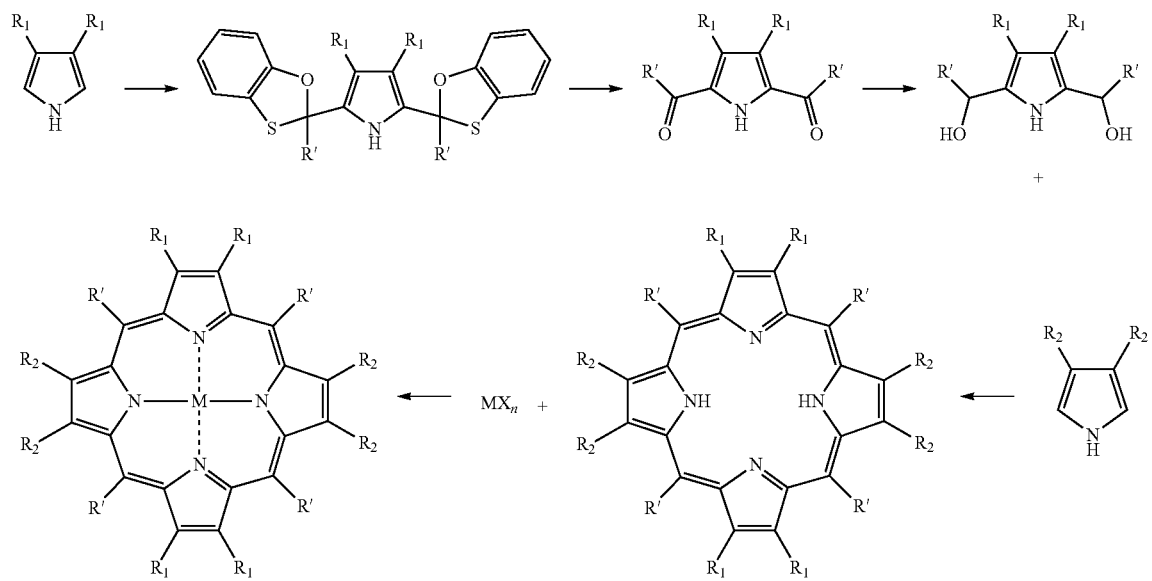

35
-continued

36
-continued

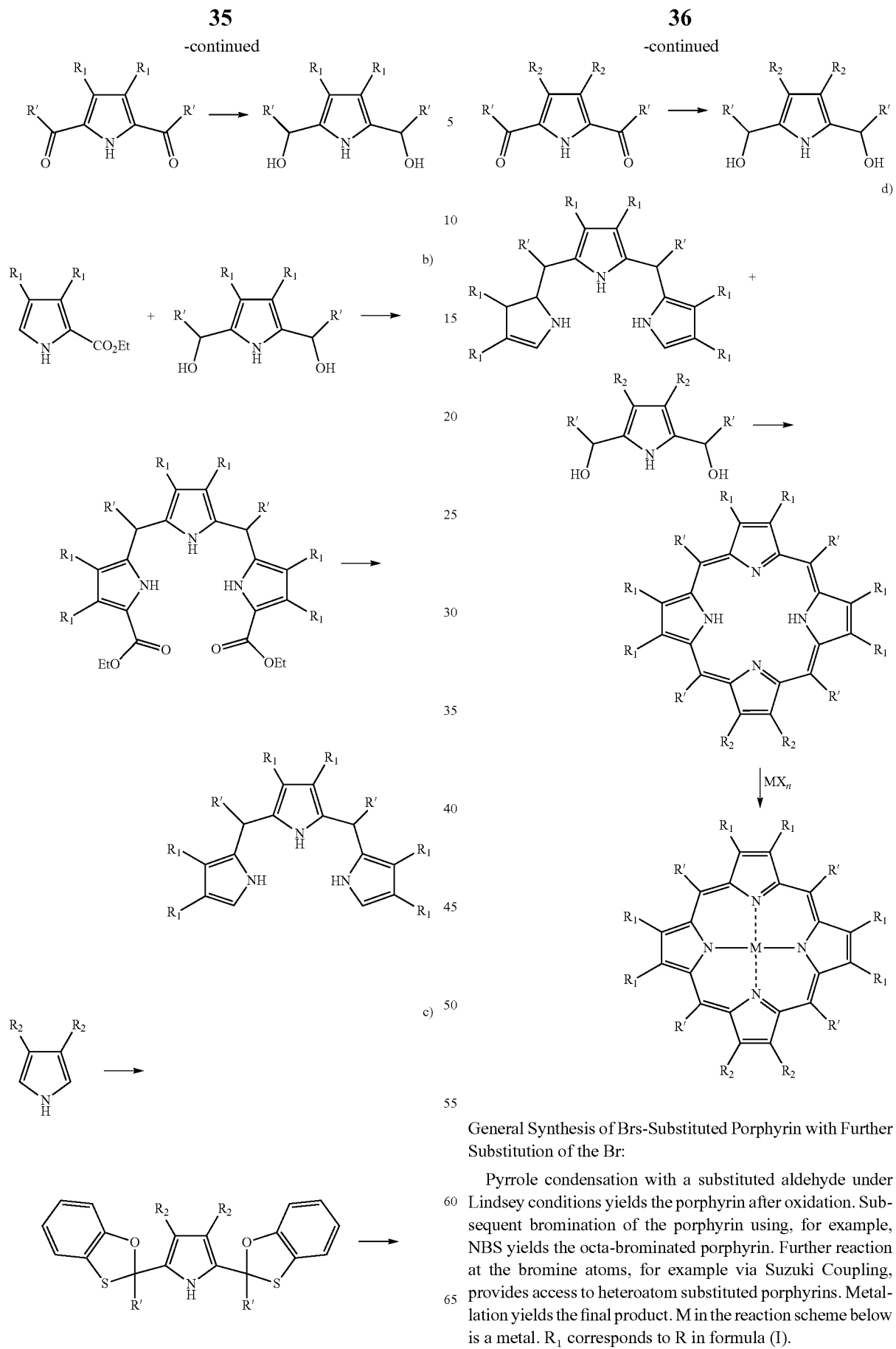

General Synthesis of Brs-Substituted Porphyrin with Further Substitution of the Br:

Pyrrole condensation with a substituted aldehyde under Lindsey conditions yields the porphyrin after oxidation. Subsequent bromination of the porphyrin using, for example, NBS yields the octa-brominated porphyrin. Further reaction at the bromine atoms, for example via Suzuki Coupling, provides access to heteroatom substituted porphyrins. Metallation yields the final product. M in the reaction scheme below is a metal. $R_1$ corresponds to R in formula (I).

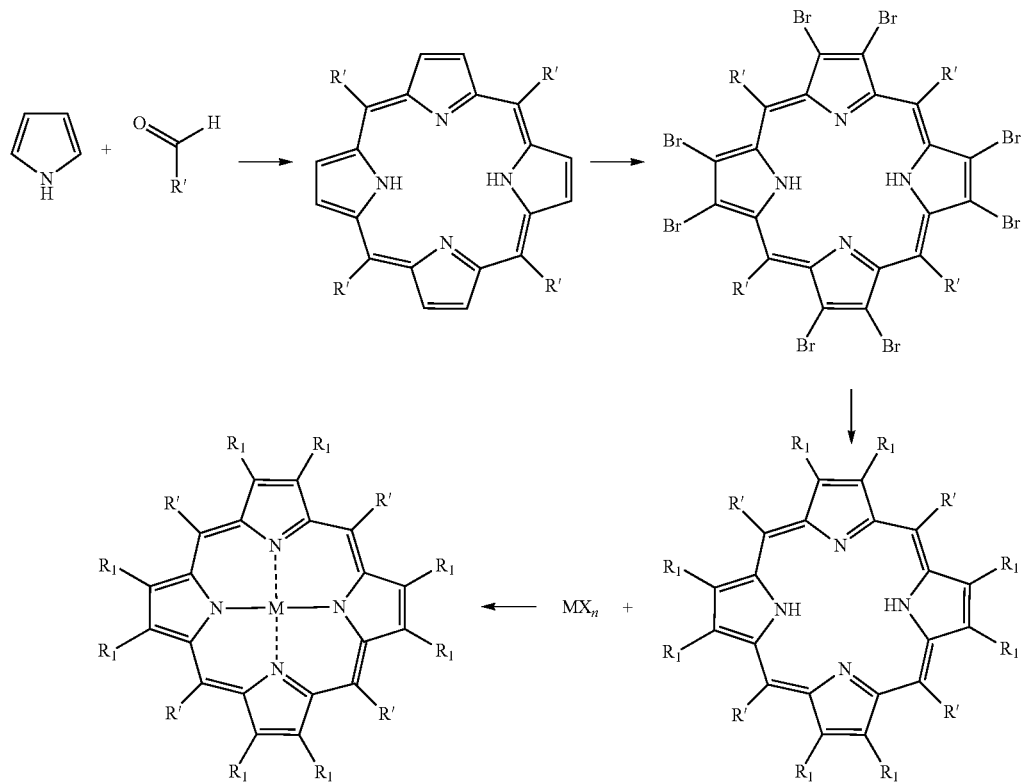

General Synthesis of meso-Br$_4$-Substituted Porphyrin with Further Substitution of the Br:

Pyrrole condensation with dimethyl acetal under acidic conditions yields the porphyrin after oxidation. Subsequent bromination of the porphyrin using, for example, NBS yields the tetra-brominated porphyrin. Further reaction at the bromine atoms, for example via Suzuki coupling, provides access to heteroatom substituted porphyrins. Metallation yields the final product. M in the reaction scheme below is a metal. R$_1$ corresponds to R in formula (I).

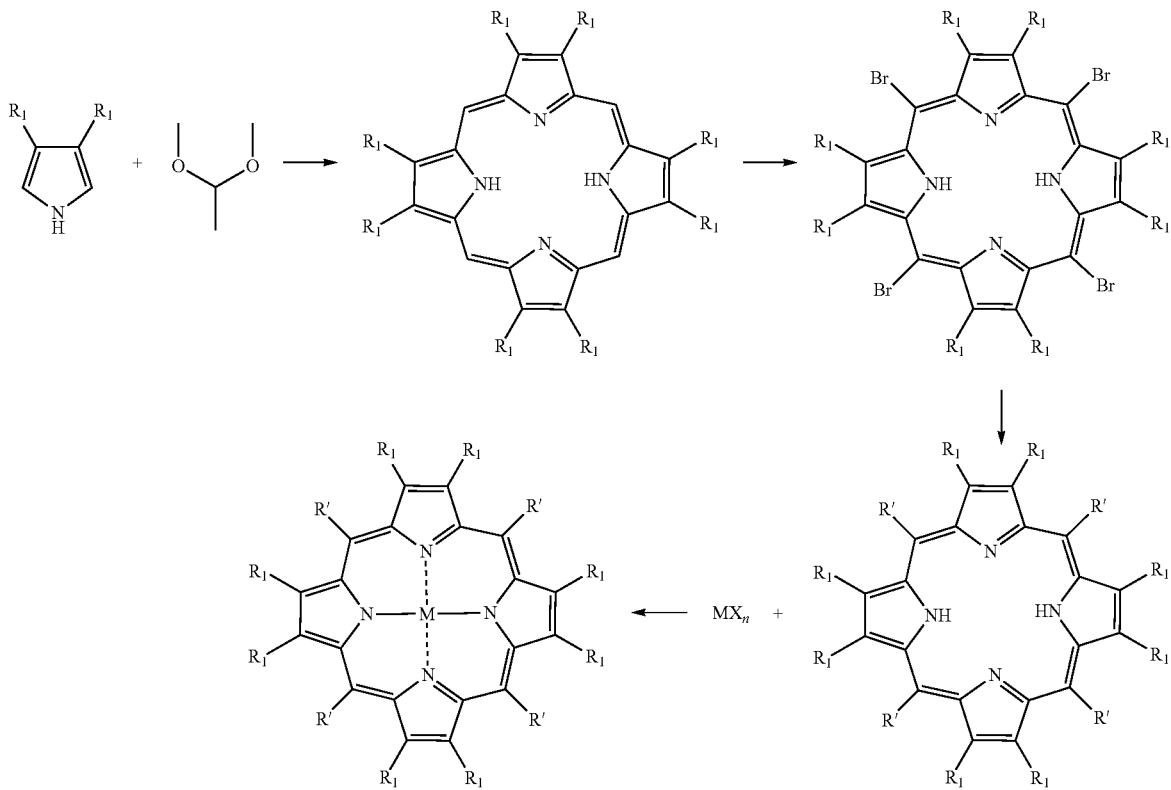

Examples of organic photovoltaic device of the present invention include: tetracene doped with Pt(TPBP)/C60/BCP/Al; and ITO/PEDOT/P3HT doped with Pt(TPBP)/C60/BCP/Al.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

REFERENCES

1. Peumans, P., A. Yakimov, and S. R. Forrest, Small molecular weight organic thin-film photodetectors and solar cells. Journal of Applied Physics, 2003. 93(7): p. 3693-3723.
2. Singh, V. P., R. S. Singh, B. Parthasarathy, A. Aguilera, J. Anthony, and M. Payne, Copper-phthalocyanine-based organic solar cells with high open-circuit voltage. Applied Physics Letters, 2005. 86(8): p. 082106.
3. Brabec, C. J., A. Cravino, D. Meissner, N. S. Sariciftci, T. Fromherz, M. T. Rispens, L. Sanchez, and J. C. Hummelen, Origin of the open circuit voltage of plastic solar cells. Advanced Functional Materials, 2001. 11(5): p. 374-380.
4. Gledhill, S. E., B. Scott, and B. A. Gregg, Organic and nano-structured composite photovoltaics: An overview. Journal of Materials Research, 2005. 20(12): p. 3167-3179.
5. Mutolo, K. L., E. I. Mayo, B. P. Rand, S. R. Forrest, and M. E. Thompson, Enhanced open-circuit voltage in subphthalocyanine/C-60 organic photovoltaic cells. Journal of the American Chemical Society, 2006. 128(25): p. 8108-8109.
6. Terao, Y., H. Sasabe, and C. Adachi, Correlation of hole mobility, exciton diffusion length, and solar cell characteristics in phthalocyanine/fullerene organic solar cells. Applied Physics Letters, 2007. 90(10): p. 103515.
7. Controlled growth of a molecular bulk heterojunction photovoltaic cell. Yang, F.; Shtein, M.; Forrest, S. R., Nat Mater 2005, 4, (1), 37-41.
8. Organic small molecule solar cells with a homogeneously mixed copper phthalocyanine: $C_{60}$ active layer. Uchida, S.; Xue, J.; Rand, B. P.; Forrest, S. R., Applied Physics Letters 2004, 84, (21), 4218-4220.
9. Asymmetric tandem organic photovoltaic cells with hybrid planar-mixed molecular heterojunctions. Xue, J.; Uchida, S.; Rand, B. P.; Forrest, S. R., Applied Physics Letters 2004, 85, (23), 5757-5759.
10. Long-range absorption enhancement in organic tandem thin-film solar cells containing silver nanoclusters. Rand, B. P.; Peumans, P.; Forrest, S. R., Journal of Applied Physics 2004, 96, (12), 7519-7526.
11. Organic solar cells: An overview focusing on active layer morphology. Benanti, T. L.; Venkataraman, D., Photosynthesis Research 2006, 87, (1), 73-81.
12. Organic photovoltaic films. Nelson, J., Current Opinion in Solid State & Materials Science 2002, 6, (1), 87-95.
13. Efficient photovoltaic energy conversion in tetracene-$C_{60}$ based heterojunctions. Chu, C. W.; Shao, Y.; Shrotriya, V.; Yang, Y., Applied Physics Letters 2005, 86, (24).
14. Efficient thin-film organic solar cells based on pentacene/$C_{60}$ heterojunctions. Yoo, S.; Domercq, B.; Kippelen, B., Applied Physics Letters 2004, 85, (22), 5427-5429.
15. Singlet Fission for Dye-Sensitized Solar Cells: Can a Suitable Sensitizer Be Found? PacI, I.; Johnson, J. C.; Chen, X.; Rana, G.; Popovic, D.; David, D. E.; Nozik, A. J.; Ratner, M. A.; Michl, J., J. Am. Chem. Soc. 2006, 128, (51), 16546-16553.

What is claimed is:

1. An organic photosensitive optoelectronic device comprising an anode, a cathode, and at least one photoactive region disposed between the anode and cathode wherein:

the at least one photoactive region comprises a donor material and an acceptor material, wherein the donor material or the acceptor material comprises at least one singlet fission host material and the at least one singlet fission host material is doped with at least one triplet forming dopant material;

the amount of the at least one singlet fission host material is greater than the amount of the at least one triplet forming dopant material; and the at least one triplet forming dopant material forms a triplet exciton after light is absorbed by the dopant; and wherein the at least one singlet fission host material is selected from the following compounds:

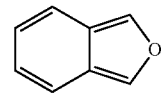

1

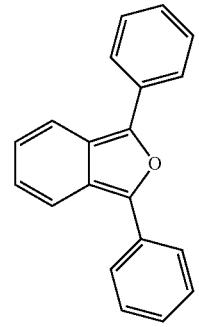

2

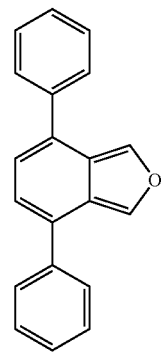

3

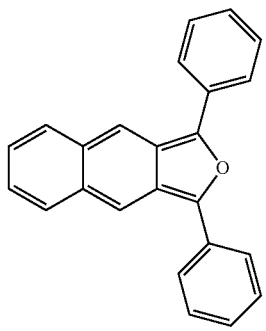
4
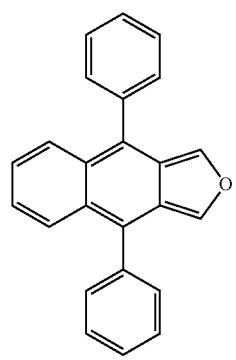
5
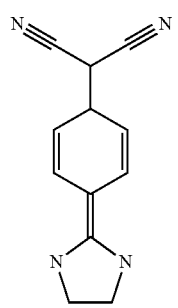
6
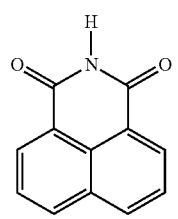
7
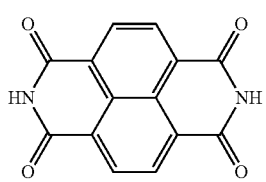
8
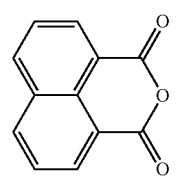
9
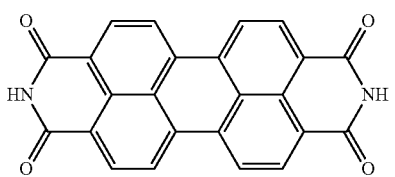
10
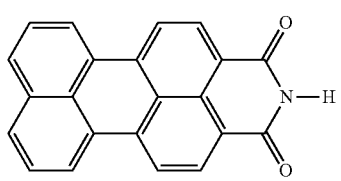
11
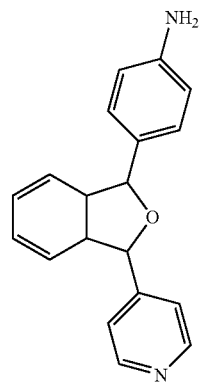
12
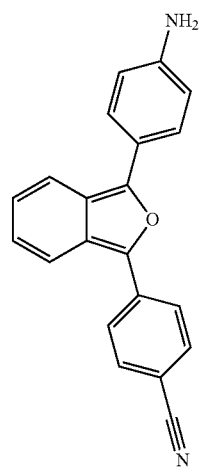
13
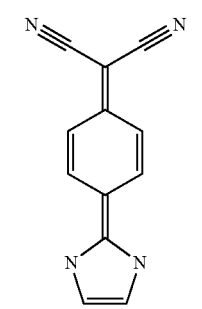
14

43
-continued

44
-continued

33
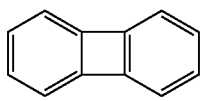
34
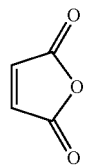
35
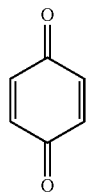
36
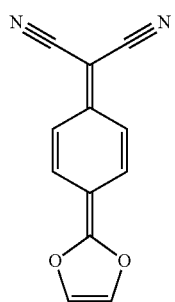
37
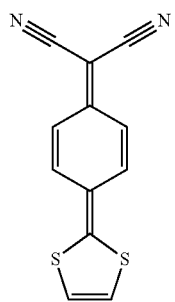
38
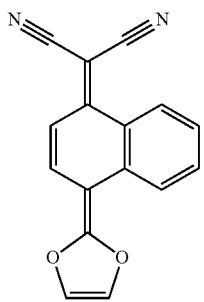
39
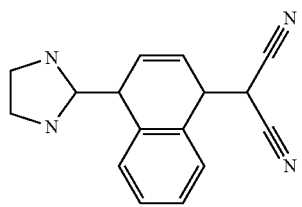
40
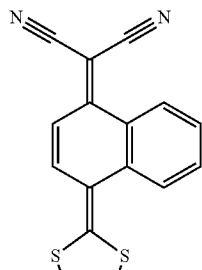
41
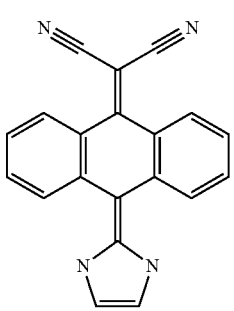
42
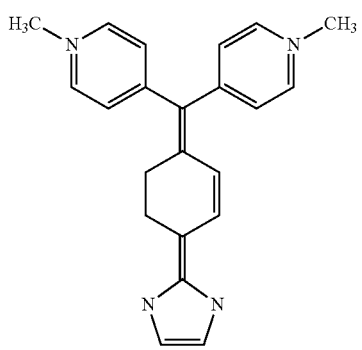
43
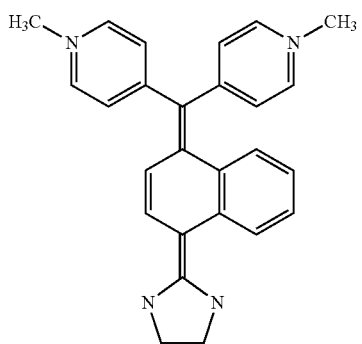
44
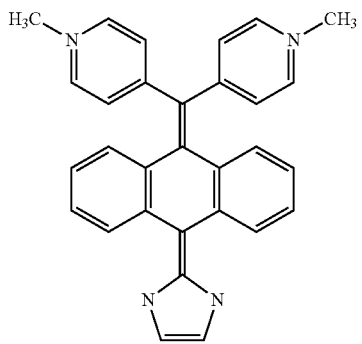

47
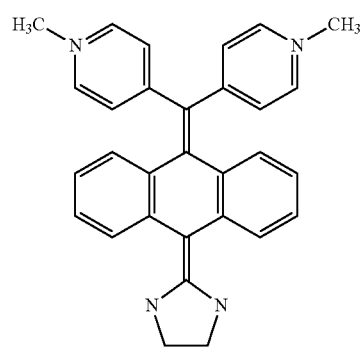
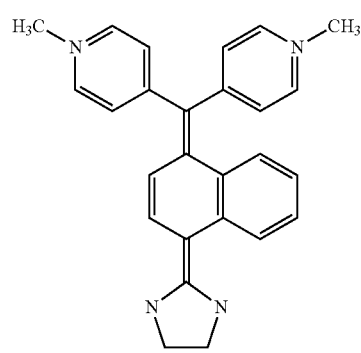
47
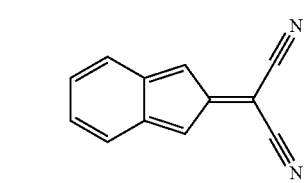
48
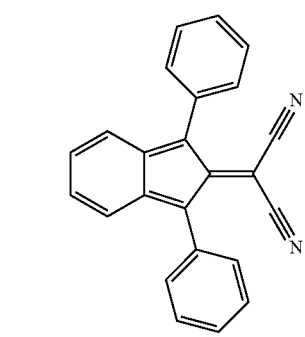
49
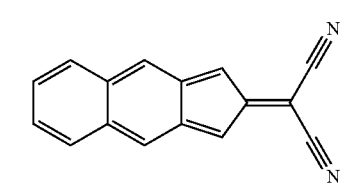
50
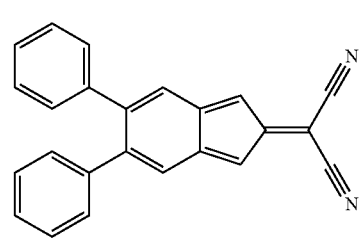
51
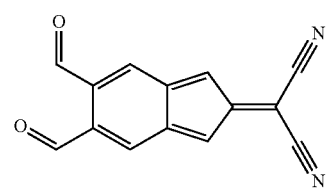
52
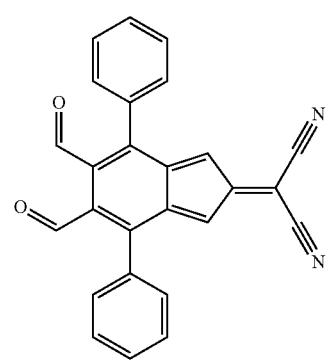
53
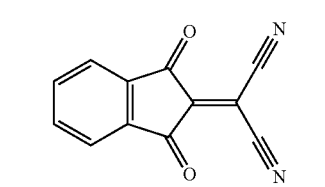
54
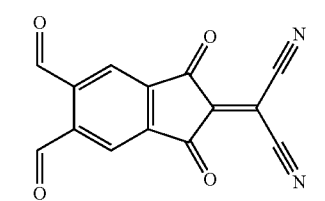
55
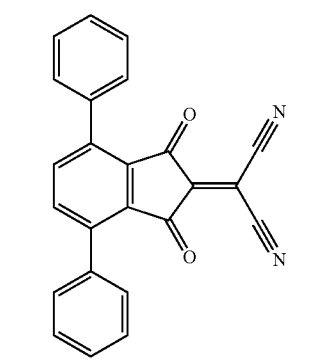
56
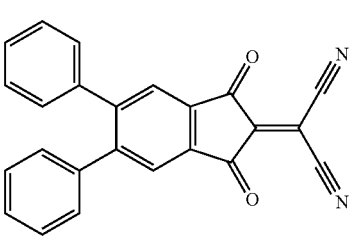

2. The device according to claim 1, wherein the at least one singlet fission host material satisfies the condition of E(S1), E(T2)>2E(T1), where E(S1) is the excitation energy of the lowest excited singlet state, E(T2) is the excitation energy of the higher triplet state, and E(T1) is the excitation energy of the lowest triplet state.

3. The device according to claim 2, wherein the at least one singlet fission host material is selected from anthracene, tetracene, and pentacene.

4. The device according to claim 1, wherein the at least one triplet forming dopant material has a higher triplet energy than that of the at least one singlet fission host material.

5. The device according to claim 1, wherein the at least one triplet forming dopant material has a singlet-triplet gap of less than about 0.5 eV.

6. The device according to claim 1, wherein the at least one triplet forming dopant material absorbs light in the red and near IR regions of the solar spectrum.

7. The device according to claim 1, wherein the at least one triplet forming dopant material is selected from porphyrin compounds and phthalocyanine complexes.

8. The device according to claim 7, wherein the at least one porphyrin compound is nonplanar.

9. The device according to claim 8, wherein the at least one nonplanar porphyrin is a compound of formula (I):

wherein
M is selected from Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Si, Ge, Sn, Pb, P, As, Sb, Bi, S, Se, Te, Po, Cl, Br, I, At, lanthanides, actinides, and 2H;

R' is independently selected from Cl, Br, I, At, and a group comprising a valence atom attached to the meso carbon of the porphyrin, wherein the valence atom is selected from B, C, N, O, Si, P, S, Cl, Ge, As, Se, Br, In, Sn, Sb, Te, I, Tl, Pb, Bi, Po and At; and R is independently selected from Cl, Br, I, At, and a group comprising a valence atom attached to a β carbon of a pyrrole ring, wherein the valence atom is selected from B, C, N, O, Si, P, S, Cl, Ge, As, Se, Br, In, Sn, Sb, Te, I, Tl, Pb, Bi, Po and At, wherein two adjacent R groups attached to the same pyrrole ring together with the two β carbons of the pyrrole ring may form a carbocyclic group or heterocyclic group.

10. A device according to claim 9, wherein the valence atom in at least one R' and R group is C.

11. A device according to claim 9, wherein the at least one R' or R group is independently selected from an alkyl group, substituted alkyl group, alkenyl group, substituted alkenyl group, alkynyl group, substituted alkynyl group, cycloalkyl group, substituted cycloalkyl group, cycloalkenyl group, substituted cycloalkenyl group, cycloalkynyl group, substituted cycloalkynyl group, aryl group, substituted aryl group, heterocyclic group and substituted heterocyclic group.

12. A device according to claim 11, wherein:

the substituted alkyl group is substituted with at least one radical independently selected from cycloalkyl groups, cycloalkenyl groups, cycloalkynyl groups, aryl groups, heterocyclic groups, hydroxy groups, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl group, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro groups, heterocyclic groups and halogen atoms;

the substituted alkenyl group is substituted with at least one radical independently selected from cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted alkynyl group is substituted with at least one radical independently selected from cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkenyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkynyl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino optionally groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted aryl group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms; and the substituted heterocyclic group is substituted with at least one radical independently selected from alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino groups optionally substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms.

13. The device according to claim 9, wherein the two adjacent R groups of at least one pyrrole ring together with the two β carbon atoms of the at least one pyrrole ring form a carbocyclic group, substituted carbocyclic group, heterocyclic group, or substituted heterocyclic group.

14. The device according to claim 13, wherein the two adjacent R groups of the at least one pyrrole ring together with the two β carbon atoms of the at least one pyrrole ring form a carbocyclic group or substituted carbocyclic group.

15. The device according to claim 14, wherein the carbocyclic group or substituted carbocyclic group is a macrocycle or benzanulated π-system.

16. The device according to claim 14, wherein the carbocyclic group or substituted carbocyclic group is aromatic.

17. A device according to claim 13, wherein the two adjacent R groups of the at least one pyrrole ring together with the two β carbon atoms of the at least one pyrrole ring form a heterocyclic group or substituted heterocyclic group.

18. The device according to claim 17, wherein the heterocyclic group or substituted heterocyclic group is aromatic.

19. The device according to claim 9, wherein the at least one R' or R group is phenyl, tolyl, xylenyl, mesityl, methyl, ethyl, n-propyl or isopropyl.

20. The device according to claim 9, wherein the at least one nonplanar porphrin is selected from the following compounds:

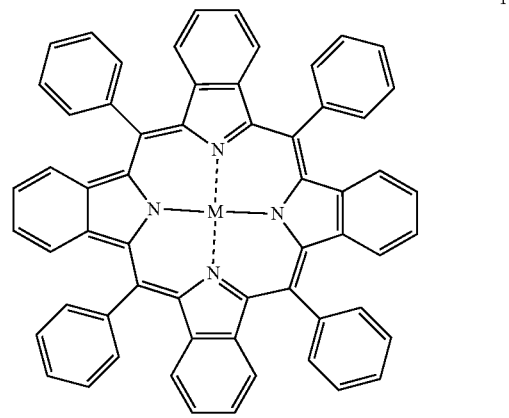

1

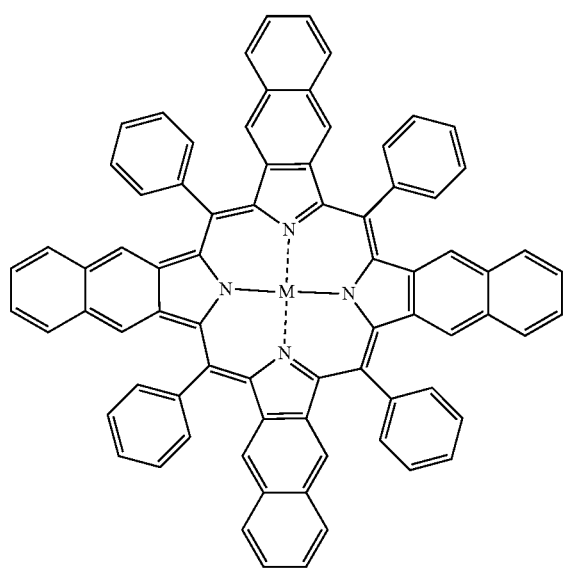

2

3
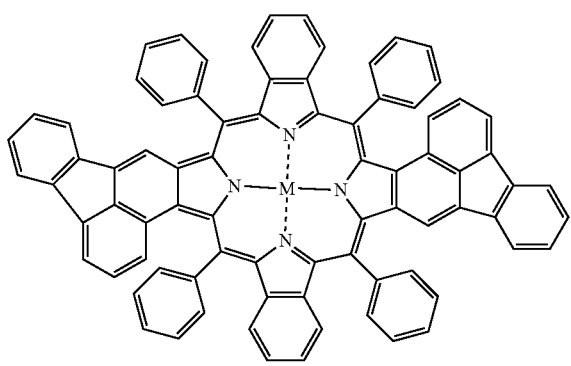
4
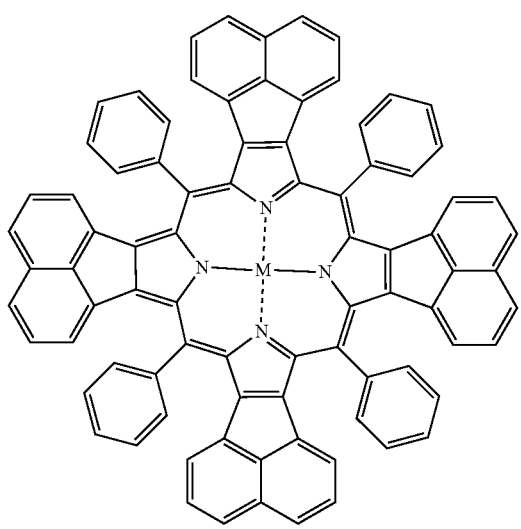
5
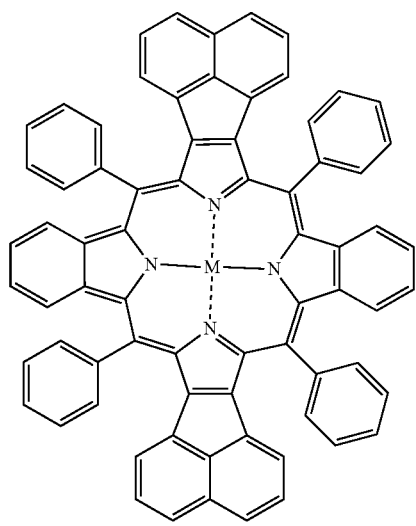
6
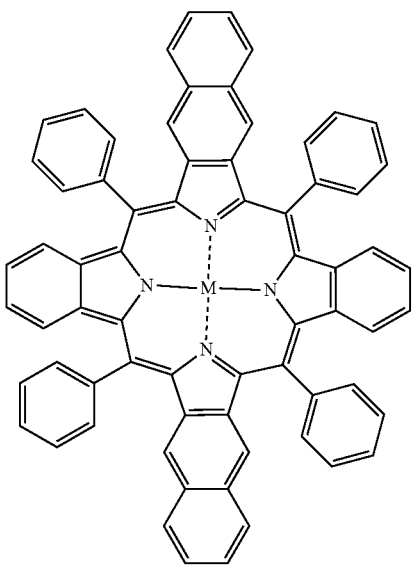
7
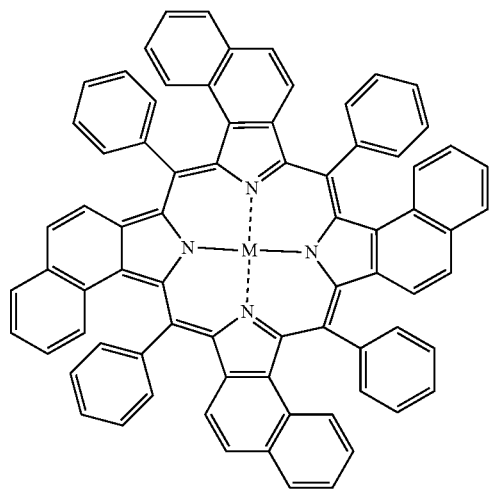
8
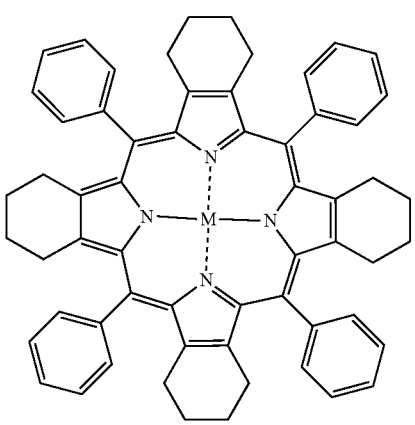

-continued

9
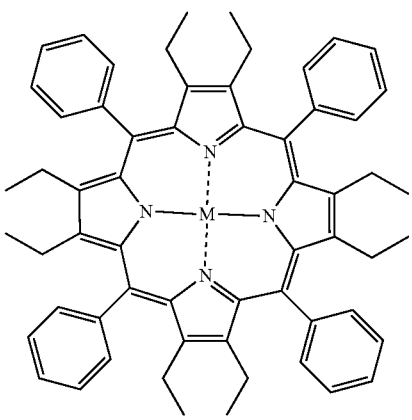

21. The device according to claim 9, wherein the valence atom in at least one R' or R group is O.

22. The device according to claim 21, wherein the at least one R' or R group is hydroxy, alkoxy, alkenyloxy, alkynyloxy, cycloakoxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy.

23. The device according to claim 22, wherein the at least one R' or R group is hydroxy or alkoxy.

24. The device according to claim 23, wherein the at least one R' or R group is OH, methoxy, ethoxy, n-propoxy or isopropoxy.

25. The device according to claim 9, wherein the at least one R or R' group is independently selected from Cl, Br, I, and At.

26. The device according to claim 9, wherein the valence atom in at least one R or R' group is N.

27. The device according to claim 26, wherein the at least one R or R' group is selected from an amino group, alkylamino groups, dialkylamino groups, alkenylamino groups, dialkenylamino groups, alkynylamino groups, dialkynylamino groups, N-alkyl-N-alkenylamino groups, N-alkyl-N-alkynylamino groups, N-alkenyl-N-alkynylamino groups, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups comprising a nitrogen valence atom, and substituted heterocyclic groups comprising a nitrogen valence atom.

28. The device according to claim 9, wherein the valence atom in at least one R or R' group is S.

29. The device according to claim 28, wherein the at least one R or R' group is selected from a thiol group, alkylthio groups, alkenylthio groups, alkynylthio groups, aralkylthio groups, aralkenylthio groups, aralkynylthio groups, cycloalkylalkylthio groups, cycloalkenylalkylthio groups, cycloalkynylalkylthio groups, cycloalkylthio groups, cycloalkenylthio groups, cycloalkynylthio groups, and arylthio groups.

30. The device according to claim 9, wherein M is Pt, Pd, or Ir.

31. The device according to claim 9, wherein the at least one nonplanar porphyrin is Pt(tetraphenyl benzo-porphyrin) or Pd(tetraphenyl benzo-porphyrin).

32. The device according to claim 1, wherein the organic photosensitive photoconductive material is tetracene doped with Platinum (tetraphenyl tetrabenzoporphyrin).

33. The device according to claim 1, wherein the device is an organic photovoltaic cell.

34. The device according to claim 1, wherein the device is a photoconductor cell.

35. The device according to claim 1, wherein the device is a photodetector.

36. The device according to claim 1, wherein the device is selected from organic photosensors, chemical sensors, and biological sensors.

37. A method of fabricating a device according to claim 1, comprising an anode, a cathode and putting at least one organic photoconductive material in contact with at least the anode or cathode wherein:

the at least one organic photoconductive material comprises at least one singlet fission host material and at least one triplet forming dopant material;

the amount of the at least one singlet fission host material is greater than the amount of the at least one triplet forming dopant material; and the at least one triplet forming dopant forms a triplet exciton after light is absorbed by the dopant; and wherein the at least one singlet fission host material is selected from the following compounds:

1
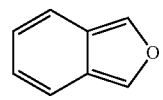

2
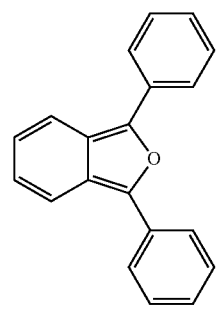

3
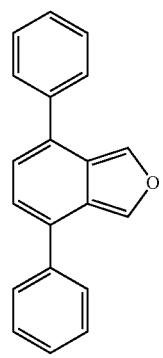

-continued
| | |
|---|---|
| 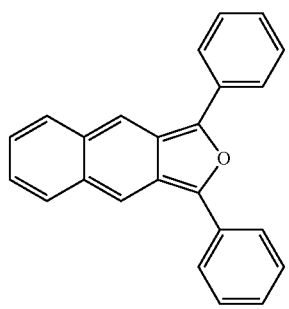 | 4 |
| 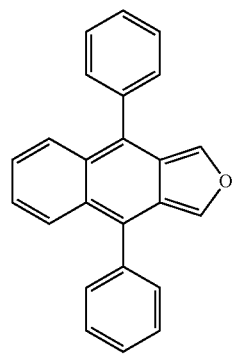 | 5 |
| 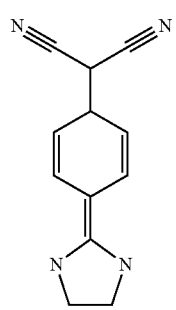 | 6 |
| 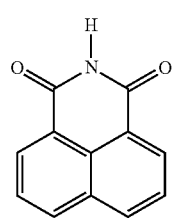 | 7 |
| 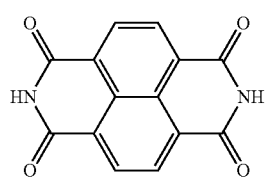 | 8 |
| 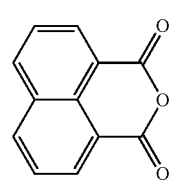 | 9 |
-continued
| | |
|---|---|
| 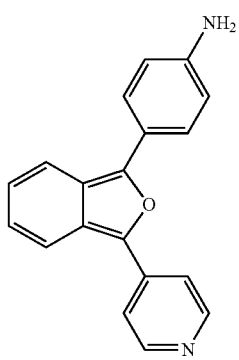 | 12 |
| 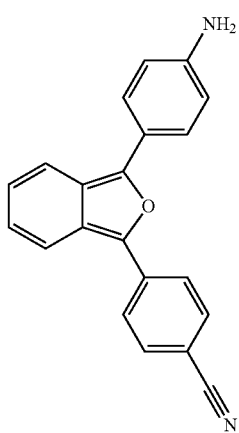 | 13 |
| 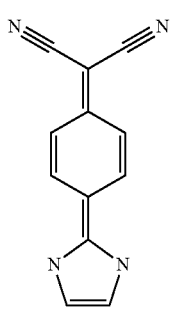 | 14 |
| 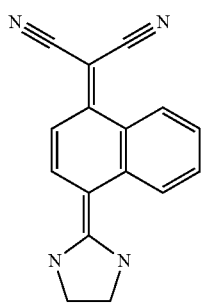 | 15 |

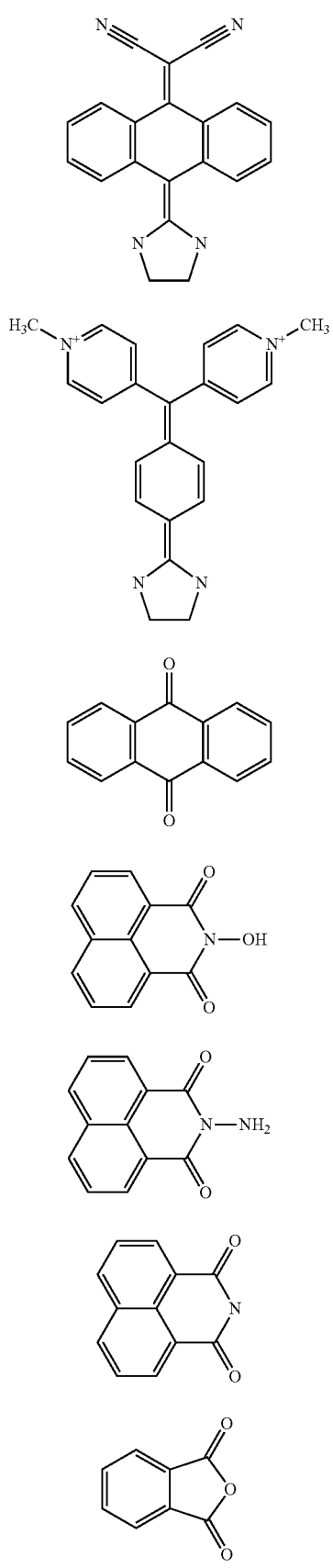
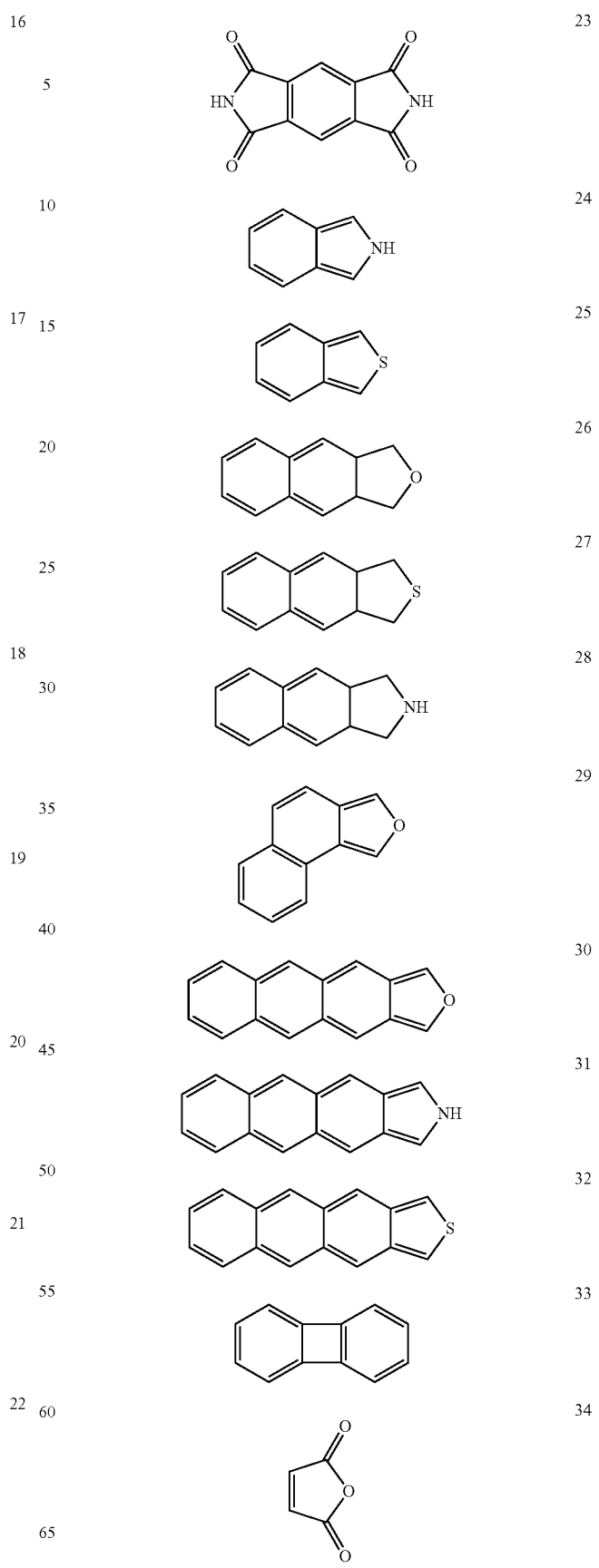

35 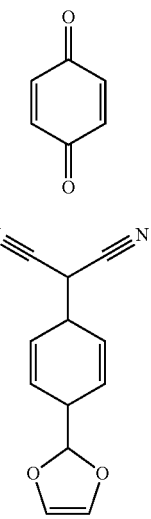
36 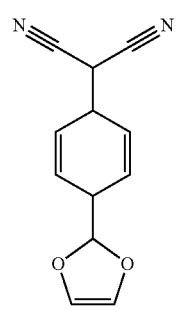
37 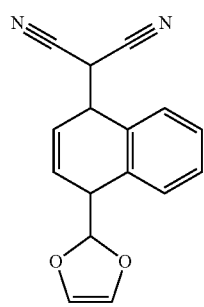
38 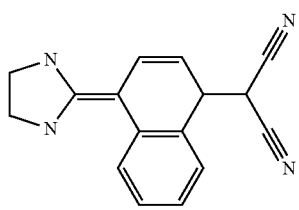
39 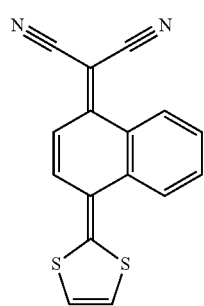
40
41 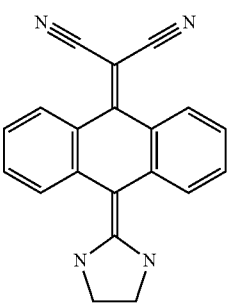
42 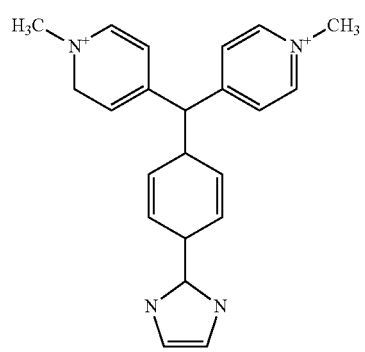
43 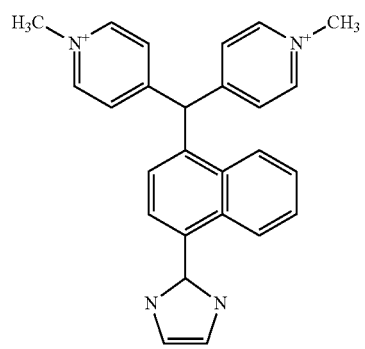
44 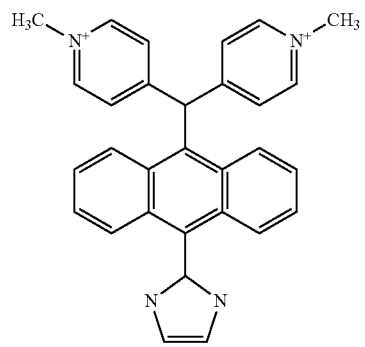

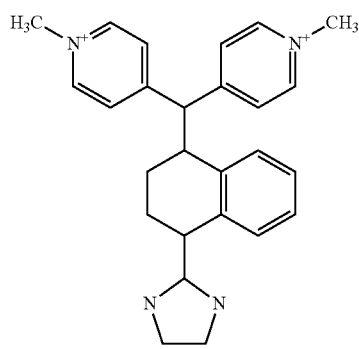
45
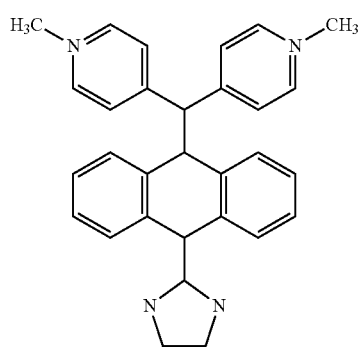
46
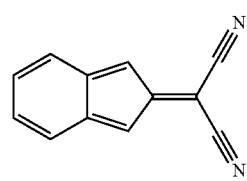
47
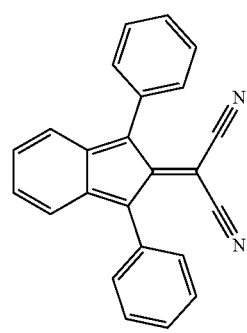
48
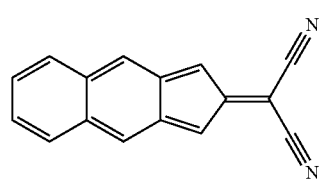
49
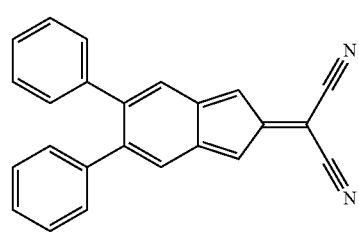
50
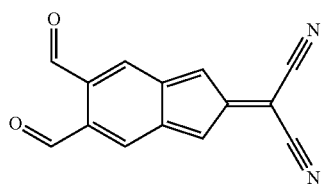
51
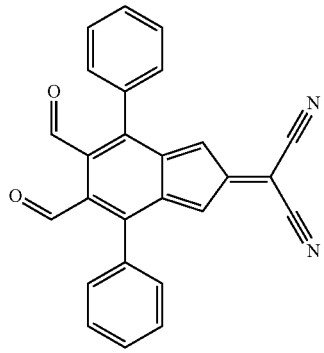
52
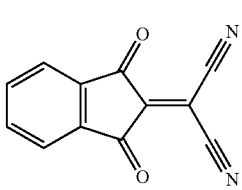
53
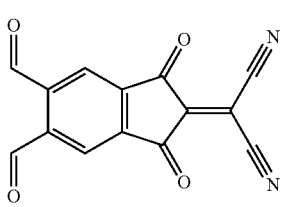
54
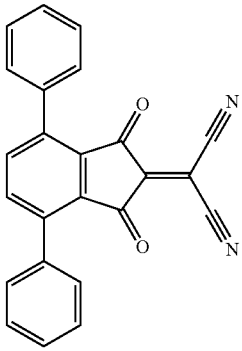
55
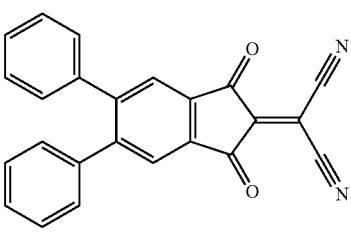
56

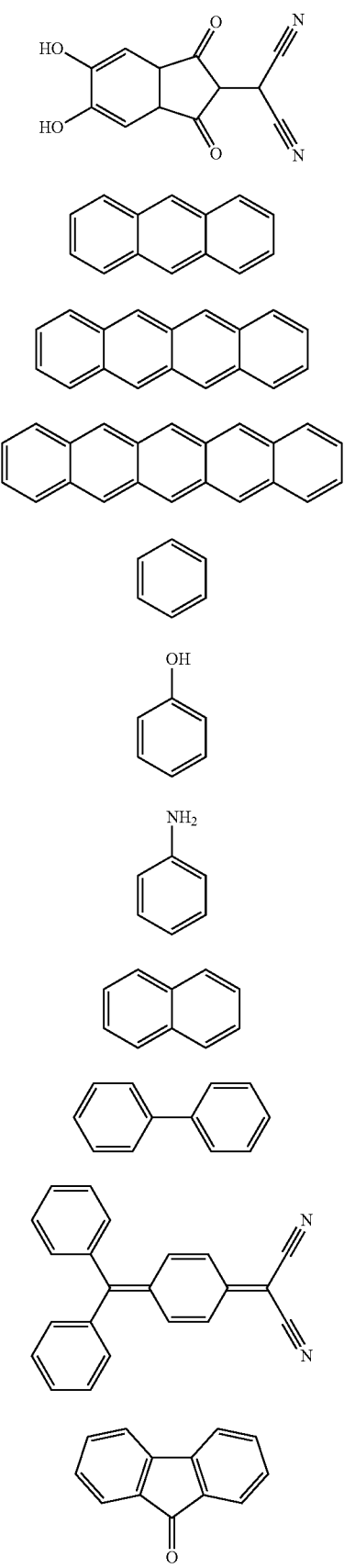

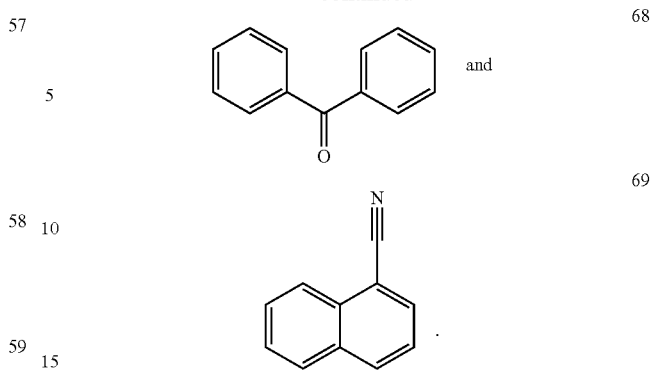

38. An organic photosensitive optoelectronic device comprising an anode, a cathode, and at least one photoactive region disposed between the anode and cathode wherein:
the at least one photoactive region comprises a donor material and an acceptor material, wherein the donor material or the acceptor material comprises at least one singlet fission host material and the at least one singlet fission host material is doped with at least one triplet forming dopant material;
the amount of the at least one singlet fission host material is greater than the amount of the at least one triplet forming dopant material; and
the at least one triplet dopant material forms a triplet exciton after light is absorbed by the dopant; and
wherein the at least one singlet fission host material is selected from the following compounds: o-xylylene, p-xylylene, isobenzofulvene, isobenzofuran, polyacene, p-sexiphenyl, tetracyano-p-quinodimethane, tetrafluoro tetracyano-p-quinodimethane, polydiacetylene, poly(p-phenylene), poly(p-phenylenevinylene), carotenoids, 1,4-bis(tetracen-5-yl) benzene, and derivatives thereof.

39. The device according to claim 38, wherein the at least one singlet fission host material satisfies the condition of E(S1), E(T2)>2E(T1), where E(S1) is the excitation energy of the lowest excited singlet state, E(T2) is the excitation energy of the higher triplet state, and E(T1) is the excitation energy of the lowest triplet state.

40. The device according to claim 38, wherein the at least one triplet forming dopant material has a higher triplet energy than that of the at least one singlet fission host material.

41. The device according to claim 38, wherein the at least one triplet forming dopant material has a singlet-triplet gap of less than about 0.5eV.

42. The device according to claim 38, wherein the at least one triplet forming dopant material absorbs light in the red and near IR regions of the solar spectrum.

43. The device according to claim 38, wherein the at least one triplet forming dopant material is selected from porphyrin compounds and phthalocyanine complexes.

44. The device according to claim 43, wherein the at least one porphyrin compound is nonplanar.

45. A method of fabricating a device according to claim 38, comprising an anode, a cathode and putting at least one organic photoconductive material in contact with at least the anode or cathode wherein:
the at least one organic photoconductive material comprises at least one singlet fission host material and at least one triplet forming dopant material;

the amount of the at least one singlet fission host material is greater than the amount of the at least one triplet forming dopant material; and the at least one triplet forming dopant forms a triplet exciton after light is absorbed by the dopant; and wherein the at least one singlet fission host material is selected from the following compounds: o-xylylene, p-xylylene, isobenzofulvene, isobenzofuran, polyacene, p-sexiphenyl, tetracyano-p-quinodimethane, tetrafluoro tetracyano-p-quinodimethane, polydiacetylene, poly(p-phenylene), poly(p-phenylenevinylene), carotenoids, 1,4-bis(tetracen-5-yl) benzene, and derivatives thereof.

* * * * *